United States Patent [19]
Scott

[11] Patent Number: 5,517,508
[45] Date of Patent: May 14, 1996

[54] METHOD AND APPARATUS FOR DETECTION AND ERROR CORRECTION OF PACKETIZED DIGITAL DATA

[75] Inventor: Edward W. Scott, Anaheim Hills, Calif.

[73] Assignees: Sony Corporation, Tokyo, Japan; Sony Trans Com, Inc., Irvine, Calif.

[21] Appl. No.: 187,596

[22] Filed: Jan. 26, 1994

[51] Int. Cl.⁶ .................................................. H03M 13/00
[52] U.S. Cl. ........................................ 371/37.1; 371/37.7
[58] Field of Search .................................. 371/37.1, 38.1, 371/39.1, 40.1, 50.1, 51.1, 37.4

[56] References Cited

U.S. PATENT DOCUMENTS

| | | | |
|---|---|---|---|
| 3,008,004 | 11/1961 | Young, Jr. | 178/23 A |
| 3,387,261 | 6/1968 | Betz | 371/50.1 |
| 3,439,332 | 4/1969 | Cook | 371/50.1 |
| 4,044,328 | 8/1977 | Herff | 371/50.1 |
| 4,185,269 | 1/1980 | Hodges et al. | 371/39.1 |
| 4,201,976 | 5/1980 | Patel | 371/50.1 |
| 4,205,324 | 5/1980 | Patel | 371/50.1 |
| 4,630,272 | 12/1986 | Fukami et al. | 371/37.4 |

FOREIGN PATENT DOCUMENTS 1183746  9/1966  European Pat. Off. .

*Primary Examiner*—Stephen M. Baker
*Attorney, Agent, or Firm*—Blakely, Sokoloff, Taylor & Zafman

[57] ABSTRACT

Digital data is stored in a buffer, and a data buffer CRC word is generated for error detection. Error correction is provided by a set of XPQ circular queues ("XPQs") used to compute an error correction syndrome. As each word is loaded into the data buffer, it is also XORed into each of the XPQs. An XPQ CRC is generated for error detection in the XPQs. The complete data packet may be transmitted or stored for later retrieval. Upon receipt or retrieval, the packet is decoded and checked for errors. The incoming data is read into a second buffer and a new CRC is generated. If the incoming CRC matches the new CRC, no errors exist and no further checking or correction is needed. If the CRCs do not match, the incoming data is used to generate new XPQ' queues and a new XPQ CRC. If the incoming XPQ CRC matches the new XPQ CRC, then the error may be correctable. XPQ imprinter circular queues ("IQ") are formed by XORing each word of the incoming XPQs with the words of the new corresponding XPQs. Intermediate correction masks are then created by sequentially writing the contents of each IQ to intermediate correction mask buffers. A single XPQ correction mask is then formed by ANDing each corresponding word of each intermediate correction mask buffer together. The correction mask is evaluated and if the errors are determined to be correctable, correction is achieved by XORing each corresponding word in the XPQ correction mask with the incoming data.

41 Claims, 23 Drawing Sheets

|  | Existing ("Old") Data Buffer CRC to New Data Buffer CRC Relationship: | |
|---|---|---|
|  | EQUAL | NOT EQUAL |
| Existing ("Old") XPQ CRC to New XPQ CRC Relationship: EQUAL | NO ERROR | MAYBE CORRECTABLE |
| NOT EQUAL | XPQ ERROR ONLY | UNCORRECTABLE |

*Figure 9*

|            | XPQ<br>(2 bit) | XPQ<br>(3 bit) |                                                                      |
|------------|----------------|----------------|----------------------------------------------------------------------|

Step 1:

```
  1 2 3 4 5 6    1 2    1 2 3
  ───────────    ───    ─────
  0 1 0 1 1 0    1 0    1 0 0     ← XPQ encoded message without errors
                                    ("Old") XPQ values)
```

Step 2:

```
  1 2 3 4 5 6    1 2    1 2 3
  ───────────    ───    ─────
  0 0 0 1 1 0    1 1    1 1 0     ← XPQ message with one error inserted
  ↑                                  ("New") XPQ values)
  └─ error
```

Step 3:

```
                        0 1                    0 1 0
                       ⌣                      ⌣
                       ↖2 bits                 ↖3 bit long XPQ
  1 2 3 4 5 6            imprinting value      imprinting value
  ───────────
  0 1 0 1 0 1    ← Mask created by XORing the two XPQ2 queues
                   together as they are rolled against each other
```

Step 4:

```
  1 2 3 4 5 6
  ───────────
  0 1 0 0 1 0    ← Mask created by XORing the two XPQ3 queues
                   together as they are rolled against each other
```

Step 5:

```
      1 2 3 4 5 6
      ───────────
      0 1 0 1 0 1    ←XPQ2 mask from step 4
  AND 0 1 0 0 1 0    ←XPQ3 mask from step 5
      ───────────
      0 1 0 0 0 0    ← Correction mask formed by ANDing the two masks
```

Step 6:

```
      1 2 3 4 5 6
      ───────────
      0 0 0 1 1 1    ←XPQ message with error
  XOR 0 1 0 0 0 0    ←Correction mask
      ───────────
      0 1 0 1 1 1    ← Corrected message (compare to Step 1 above)
```

| ROW | 2 | 3 | 5 | 7 | 11 | 13 | 17 | 19 | 23 | 29 | 31 | 37 | XORs | XPQ Words | Covered Data Words | RR (%) | CC (%) | EC |
|---|---|---|---|---|---|---|---|---|---|---|---|---|---|---|---|---|---|---|
| 1 | ● | ● | | | | | | | | | | | 2 | 5 | 6 | 45 | 9.1 | 0.20 |
| 2 | ● | ● | ● | | | | | | | | | | 3 | 10 | 30 | 25 | 2.5 | 0.10 |
| 3 | ● | ● | ● | ● | | | | | | | | | 4 | 17 | 210 | 7.24 | 0.49 | 0.066 |
| 4 | ● | ● | ● | ● | ● | | | | | | | | 5 | 28 | 2,300 | 1.2 | 0.043 | 0.036 |
| 5 | ● | ● | ● | ● | ● | ● | | | | | | | 6 | 41 | 30,030 | 0.14 | 3.3E-3 | 0.024 |
| 6 | ● | ● | ● | ● | ● | ● | ● | | | | | | 7 | 58 | 510,510 | 1.1E-2 | 2.0E-4 | 0.018 |
| 7 | ● | ● | ● | ● | ● | ● | ● | ● | | | | | 8 | 77 | 9,699,690 | 8.0E-4 | 1.0E-5 | 0.013 |
| 8 | ● | ● | ● | ● | ● | ● | ● | ● | ● | | | | 9 | 100 | 223,092,870 | 4.5E-5 | 4.9E-7 | 0.011 |
| 9 | ● | ● | ● | ● | ● | ● | ● | ● | ● | ● | | | 10 | 129 | 6,469,693,230 | 2.0E-6 | 1.6E-8 | 0.0080 |
| 10 | ● | ● | ● | ● | ● | ● | ● | ● | ● | ● | ● | | 11 | 160 | 200,560,490,130 | 8.0E-8 | 5.0E-10 | 0.0063 |
| 11 | ● | ● | ● | ● | ● | ● | ● | ● | ● | ● | ● | ● | 12 | 197 | 7,420,738,134,810 | 2.7E-9 | 1.3E-11 | 0.0048 |
| 12 | | ● | ● | | | | | | | | | | 2 | 8 | 15 | 35 | 4.4 | 0.13 |
| 13 | | | ● | ● | | | | | | | | | 2 | 12 | 35 | 25 | 2.1 | 0.084 |
| 14 | | | | ● | ● | | | | | | | | 2 | 18 | 77 | 19 | 1.1 | 0.058 |
| 15 | | | | | ● | ● | | | | | | | 2 | 24 | 143 | 14 | 0.60 | 0.043 |
| 16 | | | | | | ● | ● | | | | | | 2 | 30 | 221 | 12 | 0.40 | 0.033 |
| 17 | | | | | | | ● | ● | | | | | 2 | 36 | 323 | 10 | 0.28 | 0.028 |
| 18 | | | | | | | | ● | ● | | | | 2 | 42 | 437 | 8.8 | 0.21 | 0.024 |
| 19 | | | | | | | | | ● | ● | | | 2 | 52 | 667 | 7.2 | 0.14 | 0.019 |
| 20 | | | | | | | | | | ● | ● | | 2 | 60 | 899 | 6.3 | 0.10 | 0.016 |
| 21 | | | | | | | | | | | ● | ● | 2 | 68 | 1,147 | 5.6 | 0.082 | 0.015 |
| 22 | | ● | ● | ● | | | | | | | | | 3 | 15 | 105 | 13 | 0.83 | 0.064 |
| 23 | | | ● | ● | ● | | | | | | | | 3 | 23 | 385 | 5.6 | 0.25 | 0.045 |
| 24 | | | | ● | ● | ● | | | | | | | 3 | 31 | 1,001 | 3.0 | 0.097 | 0.032 |
| 25 | | | | | ● | ● | ● | | | | | | 3 | 41 | 2,431 | 1.7 | 0.041 | 0.024 |
| 26 | | | | | | ● | ● | ● | | | | | 3 | 49 | 4,199 | 1.2 | 0.024 | 0.020 |
| 27 | | | | | | | ● | ● | ● | | | | 3 | 59 | 7,429 | 0.79 | 0.013 | 0.017 |
| 28 | | | | | | | | ● | ● | ● | | | 3 | 71 | 12,673 | 0.56 | 0.0079 | 0.014 |
| 29 | | | | | | | | | ● | ● | ● | | 3 | 83 | 20,677 | 0.40 | 0.0048 | 0.012 |
| 30 | | | | | | | | | | ● | ● | ● | 3 | 97 | 33,263 | 0.29 | 0.0030 | 0.010 |
| 31 | | ● | ● | ● | ● | | | | | | | | 4 | 26 | 1,155 | 2.2 | 0.085 | 0.039 |
| 32 | | | ● | ● | ● | ● | | | | | | | 4 | 36 | 5,005 | 0.71 | 0.020 | 0.028 |
| 33 | | | | ● | ● | ● | ● | | | | | | 4 | 48 | 17,017 | 0.28 | 0.0059 | 0.021 |
| 34 | | | | | ● | ● | ● | ● | | | | | 4 | 60 | 46,189 | 0.13 | 0.0022 | 0.017 |
| 35 | | | | | | ● | ● | ● | ● | | | | 4 | 72 | 96,577 | 0.075 | 0.0010 | 0.013 |
| 36 | | | | | | | ● | ● | ● | ● | | | 4 | 88 | 215,441 | 0.041 | 0.00046 | 0.011 |
| 37 | | | | | | | | ● | ● | ● | ● | | 4 | 102 | 392,863 | 0.026 | 0.00025 | 0.0096 |
| 38 | | | | | | | | | ● | ● | ● | ● | 4 | 120 | 765,049 | 0.016 | 0.00013 | 0.0081 |

RR = Redundancy_Rate =
   XPQ_Words * 100% / (XPQ_Bits + Covered_Data_Words)

CC = Correction_Capability =
   Correctable_Words * 100% / (XPQ_Bits + Covered_Data_Words)

EC = EDC_Capability = Correction_Capability/Redundancy_Rate

METHOD AND APPARATUS FOR DETECTION AND ERROR CORRECTION OF PACKETIZED DIGITAL DATA

BACKGROUND OF THE INVENTION

1. Field of the Invention

The present invention relates to methods and apparatus for digital error detection and correction.

2. Art Background

The transmission and reception of digitized data is common place in today's high technology society. Computer networks, microprocessors, telephone and telephone communication systems, and financial transactions all rely on the accurate transmission of digital data between different locations. The transmission of accurate facsimile, data, telephone, and credit card authentication and verification transactions all rely upon digital transmissions in which any errors in the transmission are detected, and optimally corrected, to prevent potentially costly errors from occurring. A variety of error detection and correction circuits, methodologies and protocols have been used in the past. For example, the use of parity bits, Hamming codes, Fire codes, Convolutional Codes, Reed-Solomon Codes, and the like, have been used in a variety of different systems over the years (see for example, Mann Young Rhee, *"Error Correcting Coding Theory"*, McGraw-Hill Publishing Company, 1989, and U.S. Pat. No. 4,435,807).

As will be described, the present invention provides an improved error correction and detection apparatus and method to provide a very high reliability packetized message transfer and storage protocol for digital data, which includes error detection and correction as a means for ensuring data accuracy. The present invention is applicable to any type of digital transmission or storage system where reliability of data is a principal concern.

SUMMARY OF THE INVENTION

The present invention provides methods and apparatus for the improved detection and correction of errors in digital data. The teachings of the present invention ensure that there is a high probability that an error in a packet of data is detected, and a determination is then made as to whether the error may be correctable. In one embodiment of the invention, digital data is packetized in 16 bit wide words. The packet includes a 210 word portion contained in a data buffer, and a data buffer CRC word for error detection. Error correction is provided by a set of four XPQ circular queues (XPQ1, XPQ2, XPQ3, and XPQ4) which are used to compute an error correction syndrome. As each successive word is loaded into the data buffer, the word is also XORed into each of the four XPQ circular queues to encode the syndrome. The circular queues each have unique lengths with respect to each other, and the length of the queues are a prime number to ensure that the product of the queue lengths only has the queue lengths as its factors. In addition, the product of the queue lengths is the longest data buffer which can be covered by a given set of circular queues. An XPQ CRC is also generated for error detection in the XPQ queues.

Once encoded, the data packet of the present invention may be transmitted over a communications medium, or stored in a storage device for later retrieval. Upon receipt or retrieval, the data packet is decoded and checked for errors. The incoming data packet is read into a second data buffer and a new data buffer CRC is generated. If the incoming data buffer CRC word matches the new data buffer CRC word, no errors exist in the data packet and no further checking or correction is needed. If the CRCs do not match, then the incoming data packet is used to generate new XPQ' queues (for example, XPQ1', XPQ2', XPQ3' and XPQ4' queues) and a new XPQ CRC. If the incoming XPQ CRC matches the new XPQ CRC, then the error(s) in the data buffer may be correctable. If the incoming XPQ CRC and the new XPQ CRC do not match, then the errors are not correctable the data packet must be retransmitted.

In one embodiment, an XPQ imprinter circular queue is formed by XORing each word of the incoming XPQ queue with the words of the new corresponding XPQ queue to create an XPQ imprinting queue (for example, (XPQ1) XOR (XPQ1')=XPQ1 imprinter queue ("IQ")). A correction mask is then formed by first generating an intermediate correction mask for each of the imprinter queues ( e.g., XPQ1 IQ, XPQ2 IQ, XPQ3 IQ, and XPQ4 IQ). Each intermediate correction mask is created by repeatedly and sequentially writing the contents of the imprinting queue to an intermediate correction mask buffer having the same length and width as the data buffer. A single XPQ correction mask is then formed by ANDing each corresponding word of each intermediate correction mask buffer together.

The correction mask is evaluated to determine if correction may properly take place, by verifying that no more than a single logical one exists in each of the XPQ correction mask buffer's bit columns. All other bits within a given column must have a value of zero in this embodiment. If any bit column contains two or more logical ones, the error cannot be corrected. Once the correction mask has been evaluated and the errors determined to be correctable, error correction takes place by executing a logical XOR operation between each corresponding word in the XPQ correction mask and the incoming data stored in the data buffer. Other embodiments of the invention are also described, wherein various numbers of XPQ queues, XPQ queue lengths and data packet lengths may be used in accordance with the teachings of the present invention.

BRIEF DESCRIPTION OF THE DRAWINGS

FIG. 9 illustrates the evaluation criteria of the present invention for decoding and checking encoded message packets.

FIG. 16 illustrates a simple example of the use of the present invention to detect and correct errors.

FIG. 17 illustrates system characteristics of the present invention using a variety of XPQ queues and word lengths.

NOTATION AND NOMENCLATURE

Figure 1:
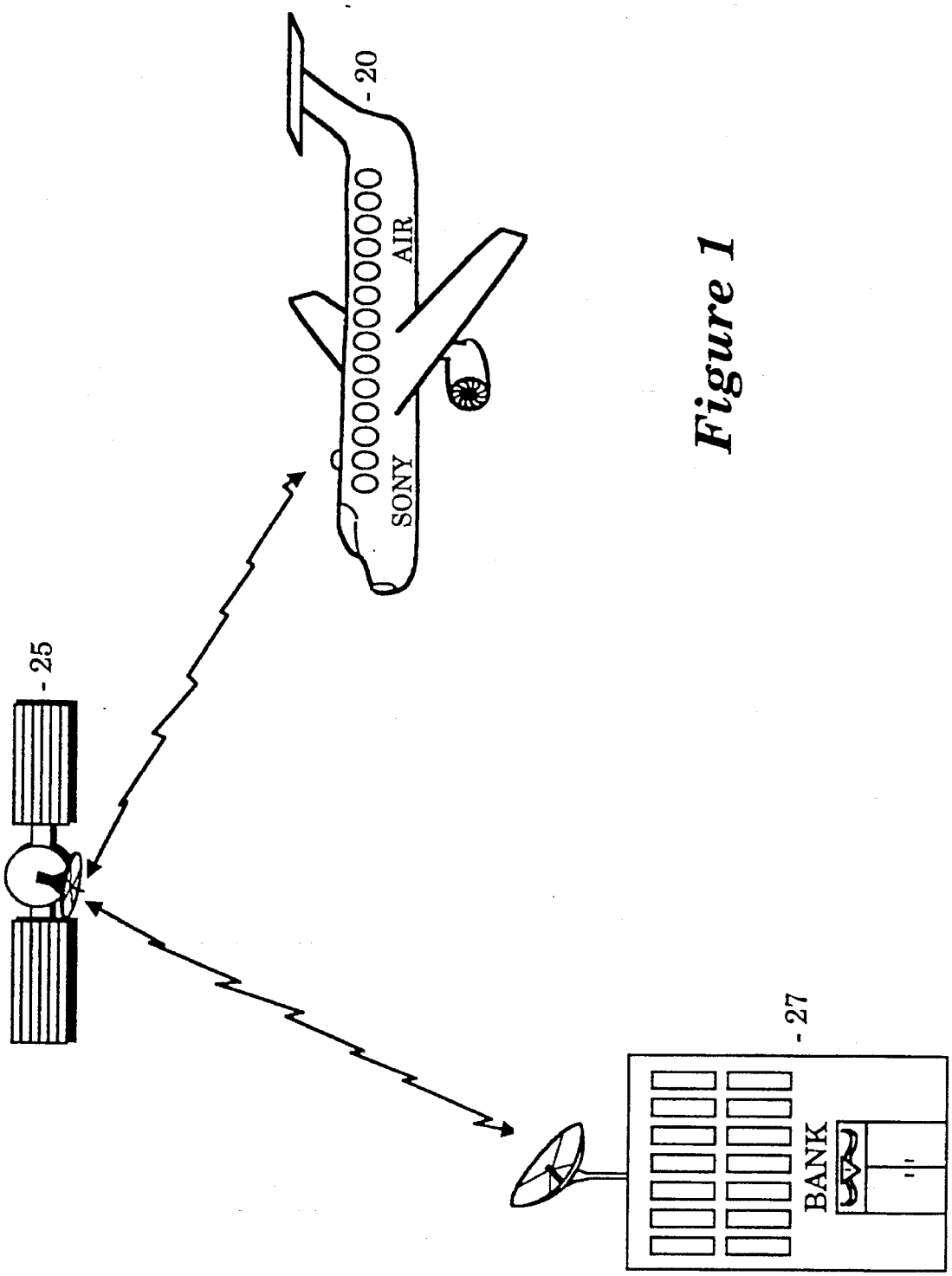
FIG. 1 conceptually illustrates one application of the present invention for error detection and correction of digital messages.

The detailed descriptions which follow are presented largely in terms of symbolic representations of operations of data processing devices. These process descriptions and representations are the means used by those skilled in the data processing arts to most effectively convey the substance of their work to others skilled in the art.

An algorithm is here, and generally, conceived to be a self-consistent sequence of steps leading to a desired result. These steps are those requiring physical manipulations of physical quantities. Usually, though not necessarily, these quantities may take the form of electrical or magnetic signals capable of being stored, transferred, combined, compared, displayed and otherwise manipulated. It proves convenient at times, principally for reasons of common usage, to refer to these signals as words, bits, values, elements, symbols, bit values, logical operations, messages, terms, numbers, or the like. It should be borne in mind, however, that all of these similar terms are to be associated with the appropriate physical quantities and are merely convenient labels applied to these quantities.

In the present invention, the operations referred to are machine operations. Useful machines for performing the operations of the present invention include general purpose digital computers, or other similar devices. In all cases, the reader is advised to keep in mind the distinction between the method operations of operating a computer and the method of computation itself. The present invention relates to method steps for transmitting, storing, receiving, encoding and decoding digital data, and processing electrical or other physical signals to generate other desired physical signals.

The present invention also relates to apparatus for performing these operations. This apparatus may be specially constructed for the required purposes or it may comprise a general purpose computer selectively activated or reconfigured by a computer program stored in the computer. The method/process steps presented herein are not inherently related to any particular computer or programming language. Various general purpose machines may be used with programs in accordance with the teachings herein, or it may prove more convenient to construct specialized apparatus to perform the required method steps. The required structure for a variety of these machines will be apparent from the description given below.

DETAILED DESCRIPTION OF THE INVENTION

A method and apparatus for the detection and correction of errors in digitized data is disclosed. In the following description for purposes of explanation, numerous details are set forth as specific word lengths, numbers of queues, word configurations, system implementations, etc. in order to provide a thorough understanding of the present invention. However, it will be apparent to one skilled in the art that these specific details are not required to practice the present invention. In other instances, well known devices, circuits and structures are not shown, or are shown in conceptual form in order not to obscure the present invention unnecessarily. It will be further appreciated by one skilled in the art that certain aspects of the present invention are described with reference to terms such as "comparing", "determining", and the like. To a casual reader, these terms may imply human attributes, such as reading, comparing, determining, etc. However, these terms are considered terms in the art of error correction and detection, and relate solely to machine functions, and no human intervention is either required, or desired, in accordance with the teachings of the present invention as disclosed herein.

Referring now to FIG. 1, one possible implementation of the present invention is illustrated. The principal objective of the present invention is to provide a very high reliability packetized message transfer and storage protocol for digital data, which includes error detection and correction as a means for ensuring data accuracy. As illustrated, an airline passenger flying in an airliner 20 may conduct a credit card transaction, use a digital packet telephone, a personal digital assistant, or conduct other business in airliner 20, which requires some transmission and/or reception of digital data outside of, or internal to, the aircraft. For purposes of this Specification, the specific type of digital data packets and their application, such as for example facsimile, packetized digital telephone, credit card authentication and verification transactions, and the like, will simply be referred to as "data packets". Data may be transmitted from the aircraft 20 to an orbiting satellite 25, and relayed to a financial institution or other ground location 27, as shown in FIG. 1. Particularly in the case of financial transactions, it is essential that the digital data packets comprising the financial information, user authentication and verification and the like be highly reliable, and that any errors in the data packets be detected, and if possible, corrected prior to the completion of the transaction. Although FIG. 1 illustrates the use of the present invention as communicating data between an aircraft, satellite and a ground location, it will be appreciated that the present invention has many uses, and is not limited to the specific examples described in this Specification. For example, the present invention also has application to packetized message protocols for client server networking systems, or for the transfer of data from earth to space and back again where data reliability is of utmost concern.

Figure 2:
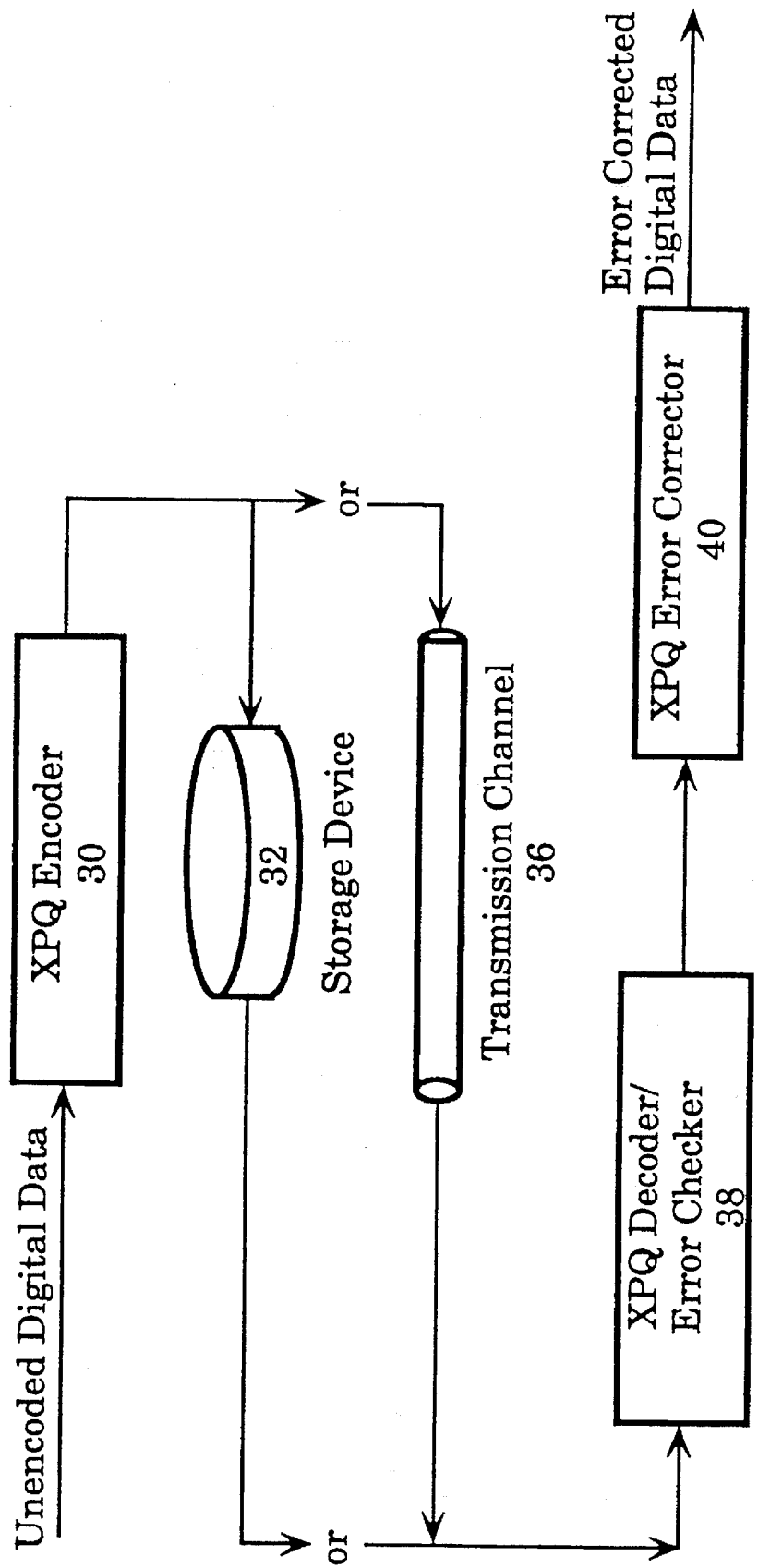
FIG. 2 is a block diagram illustrating one embodiment of the error detection and correction system of the present invention.

Referring now to FIG. 2, one system for use in conjunction with the present invention is illustrated in block diagram form. For purposes of this Specification, the error detection and correction method of the present invention is referred to at times herein as "XPQ", which is an abbreviation for XORed Prime Queue error detection and correction. As shown in FIG. 2, unencoded digital data is coupled to an XPQ encoder 30. The XPQ encoder 30 encodes the data, appending onto the data a syndrome which is used for error detection and correction. The encoded data packets may be stored in a storage device 32 or transmitted over a transmission channel 36, as shown in the figure. The storage device 32 may comprise a hard disk memory, floppy disk, optical disk or other storage device for use in a digital data processing system. The transmission channel 36 may take the form of a telephone line, satellite link, fiber optic transmission cable, or any other communication medium. The data either stored in the storage device 32 or transmitted over the transmission channel 36 is ultimately coupled to an XPQ decoder/error checker 38, for decoding the encoded data and determining if any data errors exist in the packets. The decoded data is then coupled to an XPQ error corrector 40 for correcting any correctable errors which were detected by the XPQ decoder/error checker 38. Error corrected digital data is then provided as an output of the XPQ error corrector 40 to the data processing, communication or other device in the particular system to which the present invention has been applied.

Figure 3:
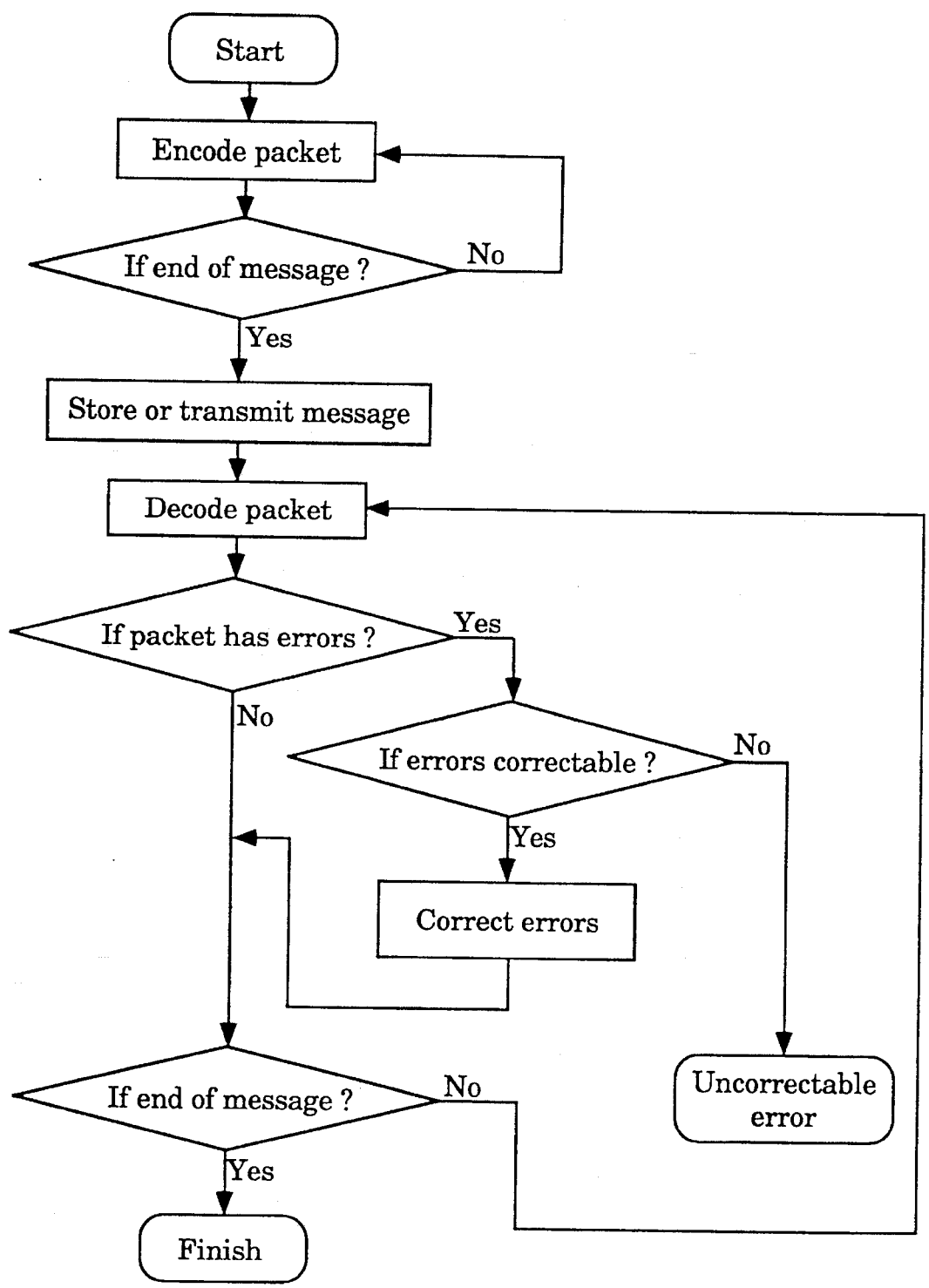
FIG. 3 is a flow chart illustrating the sequence of steps executed by the present invention to detect and correct errors in digital data.

Referring now to FIG. 3, a flow chart illustrating the overall process of the present invention for encoding, decoding and the correction of errors is illustrated. In accordance with the teachings of the present invention, data is packetized such that error detection and correction syndrome information is appended to the data portion of each packet. In practice, and as illustrated in the flow chart of FIG. 3, each portion of data in a message is encoded with the error detection and correction syndrome, and the process is repeated until the entire message is encoded into packets. As previously described, the message may be stored or transmitted. If errors occur during the storage or transmission, it may be possible to correct them using the teachings of the present invention as taught herein. As shown in the flow chart of FIG. 3, if the data portion of a packet is determined to have errors, it is checked for possible correctability of the errors. If the errors are found to be correctable, then using the teachings of the present invention, the errors are corrected. If it is determined that the errors are uncorrectable, it may be possible to request a retransmission of the particular data packet. In the case of stored packets where errors are found to be uncorrectable, the data may be unrecoverable. As shown in FIG. 3, the decode-error check-process continues until the entire message has been checked for errors, and if possible, the errors corrected.

Figure 4:
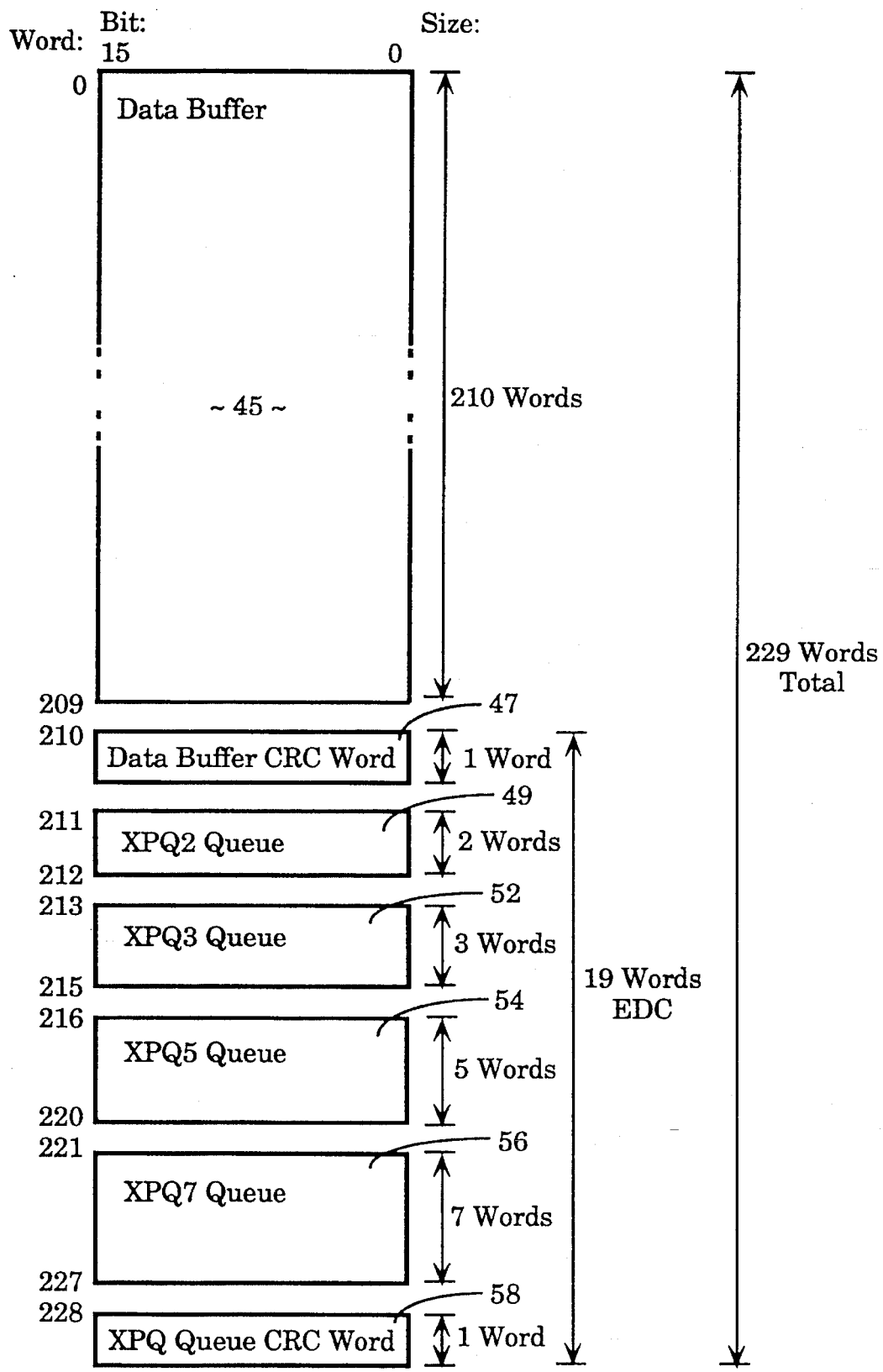
FIG. 4 illustrates a typical message packet for 16 bit wide words utilizing the teachings of the present invention.

Referring now to FIG. 4, an illustrative XPQ message packet for exemplary 16 bit wide words is illustrated. As shown in FIG. 4, the message packet includes a data portion, which, in the present example, is stored in a 210 word long data buffer identified by the numeral 45. The message packet also includes a cyclic redundancy check (CRC) word 47 for providing error detection for the data stored in buffer 45. As illustrated, the present invention includes four syndrome queues 49, 52, 54, and 56. It must be noted that each of the lengths of the XPQ circular queues is unique, and optimally, the word lengths of the circular queues should be prime numbers to ensure that the product of the queue lengths only has the queue lengths as its factors. The XPQ queues provide storage for the syndrome required for the correction of errors within the data stored in data buffer 45. In addition, as illustrated in FIG. 4, an XPQ CRC word 58 is further provided for the detection of any errors within the syndrome stored in the XPQ queues 49, 52, 54 and 56.

In accordance with the teachings of the present invention, the maximum length of data buffer 45 is preferably equivalent to the product of the XORed Prime Queue lengths. In the example of FIG. 4, the product of 2×3×5×7 equals the length of the data buffer 45, namely, 210 words. Accordingly, using the queue lengths shown in FIG. 4, a maximum of 210 data words can be covered by the present invention. However, it will be appreciated that fewer words in the data buffer 45 may be utilized. Alternatively, the length of the XPQs themselves may be lengthened to provide additional coverage for more words within the data buffer 45, as will be described more fully below. A second alternative method for providing additional coverage for more words within the data buffer is to provide additional XPQ queues. Accordingly, it will be appreciated, that the product of the XPQ's circular queue lengths is the longest data buffer which can be covered by a given set of XPQ circular queues and still guarantee error correction for the specified error conditions. In the presently preferred embodiment, a minimum of two XPQ circular queues are provided, however there is no upper limit on the number of XPQ circular queues which may be employed. The maximum burst error correction capability of an XPQ error correction and detection system utilizing the teachings of the present invention is identical to the word width of the XPQ circular queues.

Figure 5A:
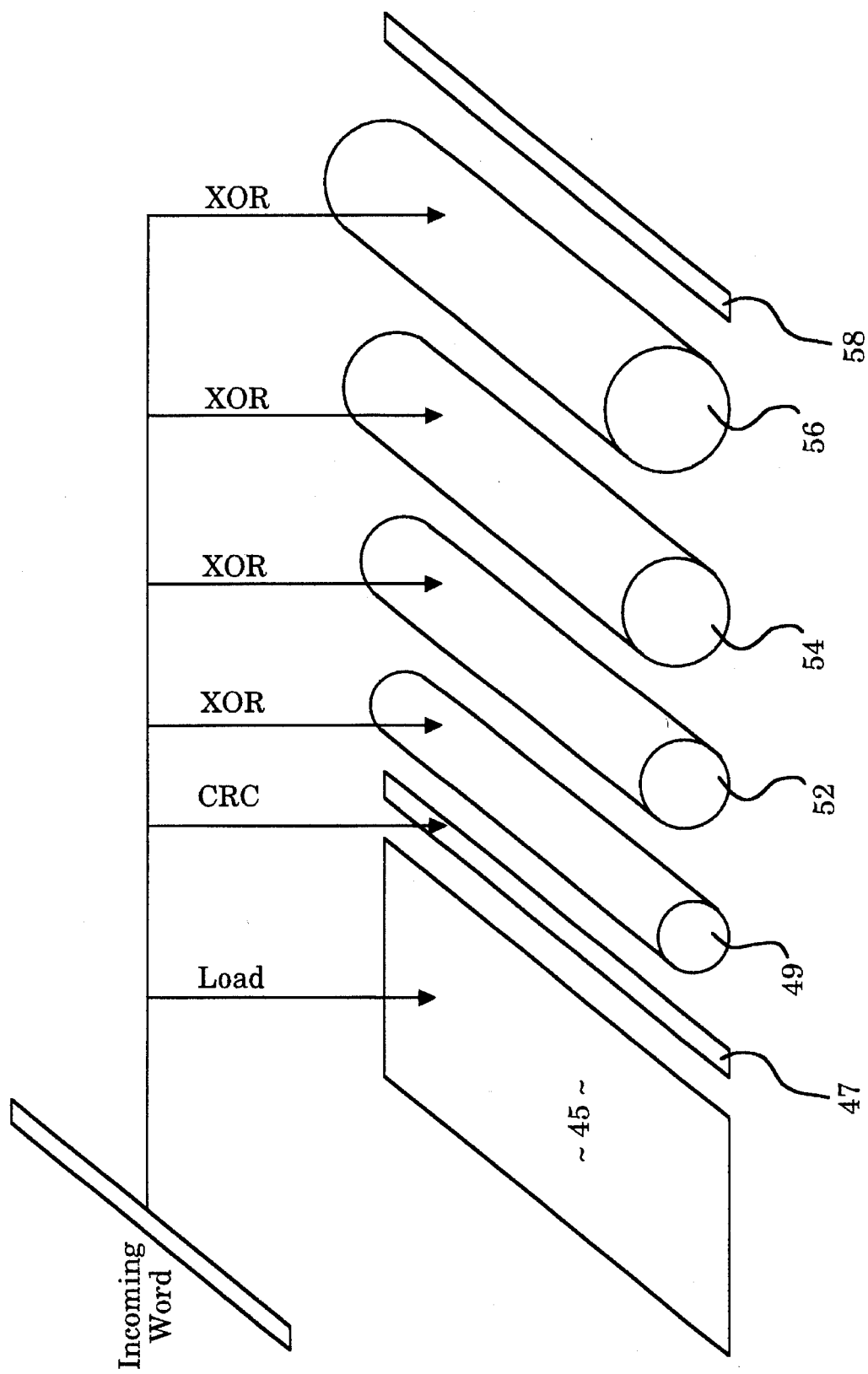
FIG. 5a conceptually illustrates the steps shown in FIG. 3 to encode a message packet in a typical implementation.
Figure 5B:
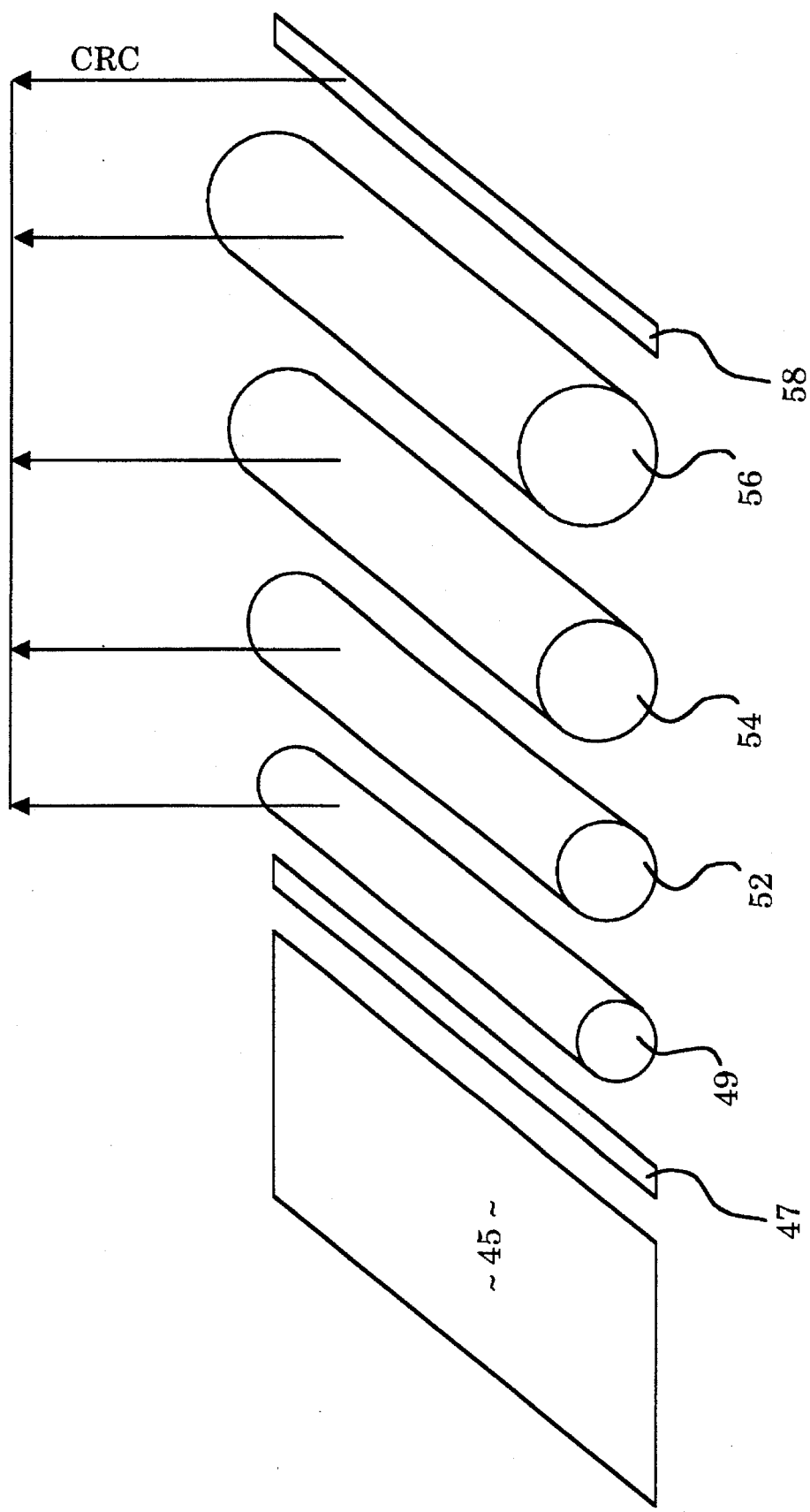
FIG. 5b conceptually illustrates the steps shown in FIG. 3 to encode a message packet in a typical implementation.
Figure 6:
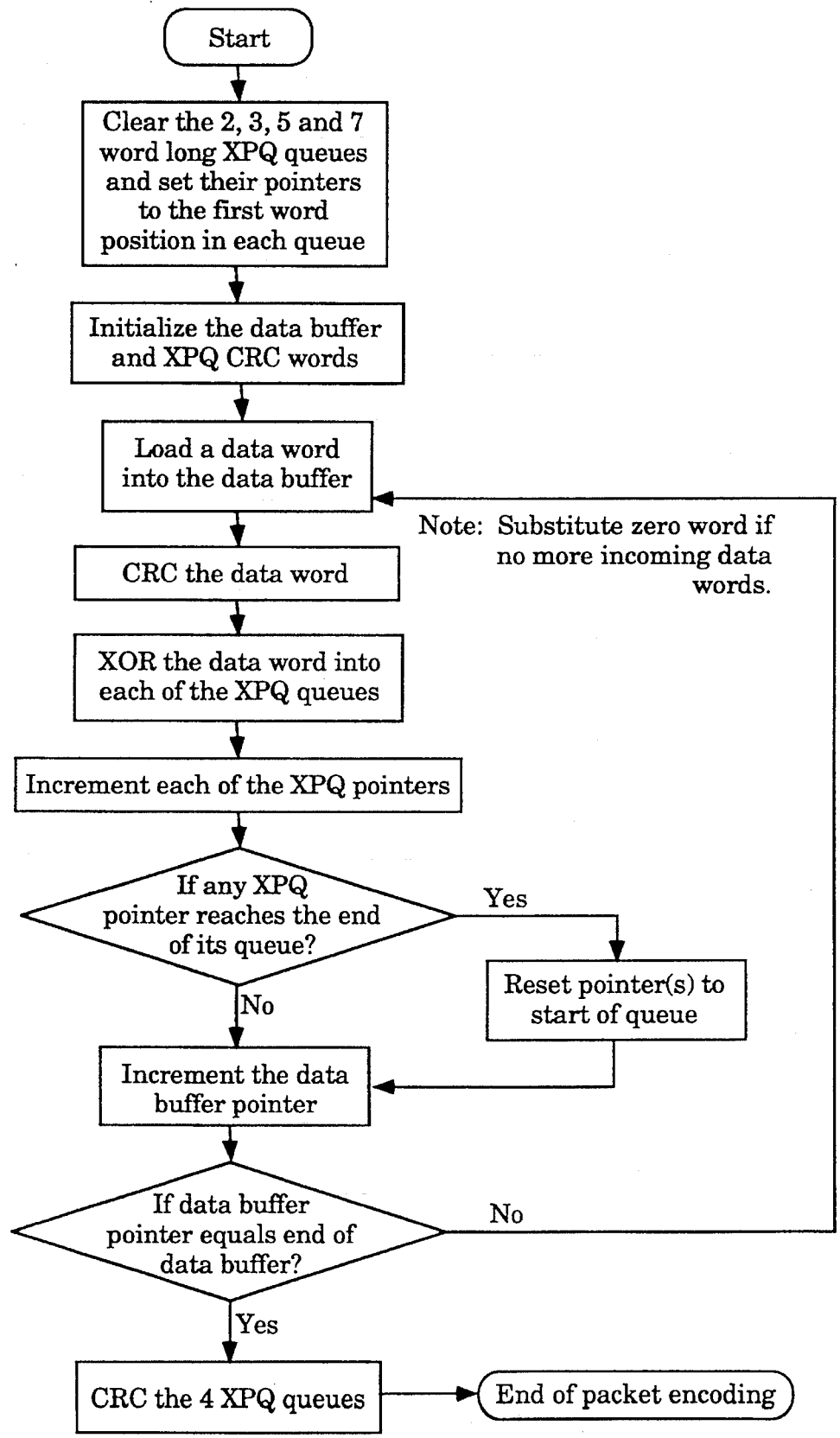
FIG. 6 is a flow chart illustrating in a more detailed manner the sequence of steps executed by the present invention to encode message packets.

Referring now to FIGS. 5a, 5b and 6c, a description of the sequence of steps executed by the present invention to encode a message packet with XPQ error correction and detection is illustrated. Referring first to FIG. 5a, a packet (illustrated in FIG. 4) is conceptually illustrated, with corresponding reference numerals relating to the same element as previously shown in FIG. 4. Initially, all of the XPQ circular queues 49, 52, 54, and 56 are cleared to zero. In addition, the CRC words 47 and 58 are initialized to minus one. An incoming word is sequentially loaded into the data buffer 45, such that the total of 210 words are loaded. Simultaneous with the loading of the data into data buffer 45, the processing of the CRC word 47 is completed, and the incoming word is also XORed into each of the XPQ circular queues 49, 52, 54, and 56, and each of the XPQ pointers are incremented. If any of the pointers in the respective XPQ buffers point to the end of its respective circular queue, it is reset to the beginning of that circular queue. After the respective XPQ pointers have been incremented and, if necessary, reset, the data buffer pointer is incremented. If the data buffer pointer has reached the last data word position in the data buffer, processing of the packet is complete. In the event that the message runs out of words before completion of the current packet, zero words may be used to fill the packet and complete the encoding process. Referring to FIG. 5b, once the data buffer is loaded with the incoming message and the XPQ error detection and correction syndromes have been generated and stored in the XPQ queues, the XPQ queues are CRCed to generate the CRC word 58. Reference is made to the flow chart illustrated in FIG. 6, which provides a more detailed description of the encoding process of the present invention.

Figure 7A:
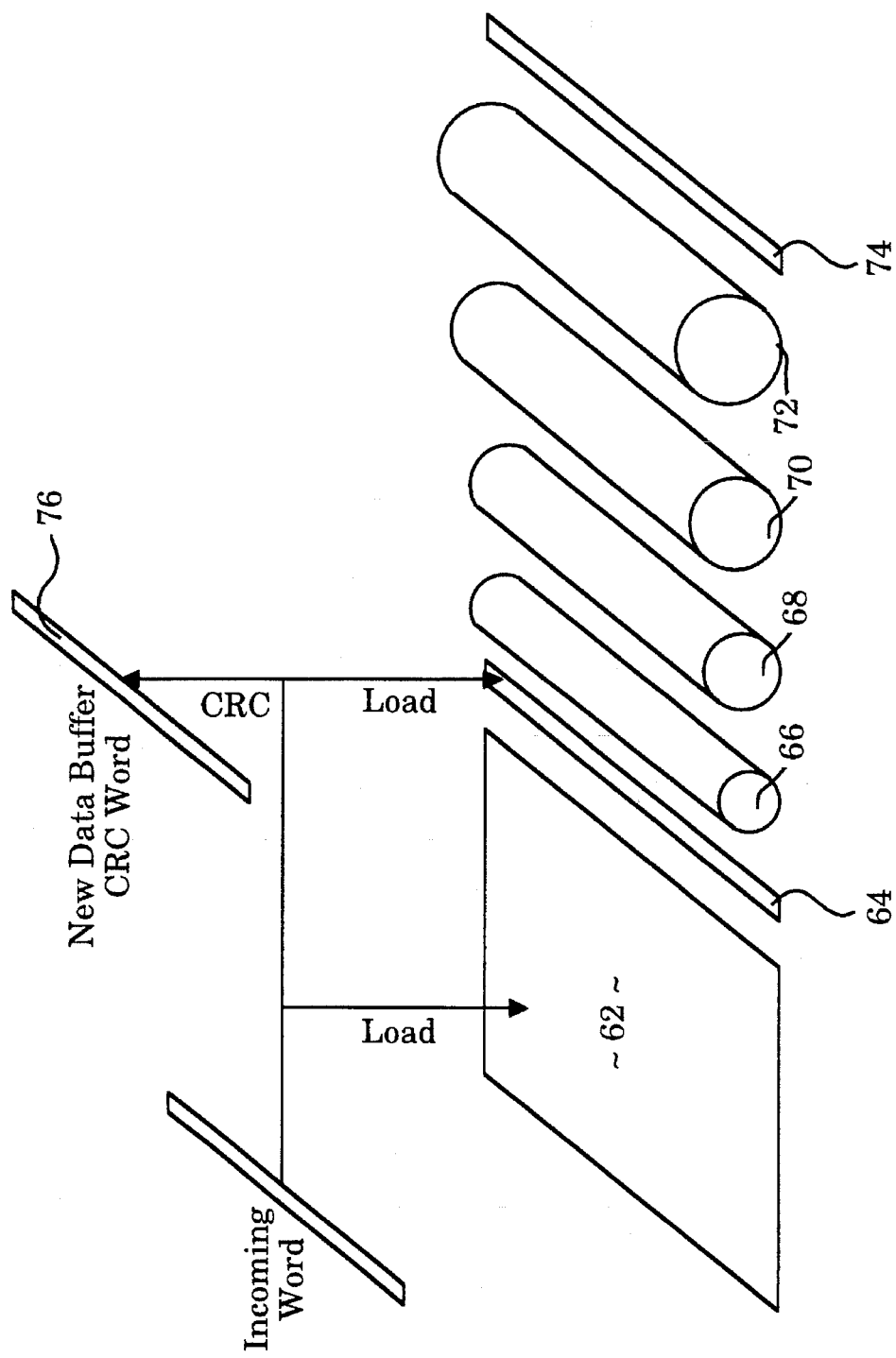
FIG. 7a illustrates the steps of the present invention to decode data encoded in accordance with the steps illustrated in FIG. 6.

Referring now to FIGS. 7a, 7b, 7c, 8a and 8b, the decoding and error checking process of the present invention will be described. As with the encoding process of the present invention, the XPQ decoding may be implemented in either hardware or software. In the diagram of FIG. 7a, an incoming encoded word is applied to the XPQ decoder/error checker 38 for decoding and error detection. The decoding process begins by initializing a receiving data buffer 62 and a CRC buffer 64. As previously described with reference to the encoding process, the CRC word stored within the buffer 64 is used to accumulate a cyclic redundancy check of the data within data buffer 62. A pointer is initialized to the first word of the data buffer 62. An incoming encoded word is sequentially read into the data buffer 62. Simultaneously, a new data buffer CRC word 76 is generated. Once the data buffer is filled, the old CRC word 47 in the incoming encoded data is stored within the buffer 64. The new data buffer CRC word 76 is compared to the incoming encoded CRC word stored in buffer 64. If the new data buffer CRC word 76 and the old CRC word received with the incoming encoded data are equal, no errors occurred in the data, such that the remainder of the incoming packet comprising the original circular queues XPQ2, XPQ3, XPQ5, and XPQ7, may be discarded. It will be appreciated that in most instances, the additional steps of the present invention are not necessary to implement if the CRC codes match, since the equality of CRC words represents a high probability check on the validity of the data buffer contents. For example, with a CRC word having a 16 bit cyclic redundancy check, there is 1 in 65,535 chances that an error can occur in the contents of the data buffer and still result in equality of the CRC words. Generally, this is a sufficient error detection test for most computer applications. However, where even greater error detection is required, a larger CRC word may be employed.

Figure 7B:
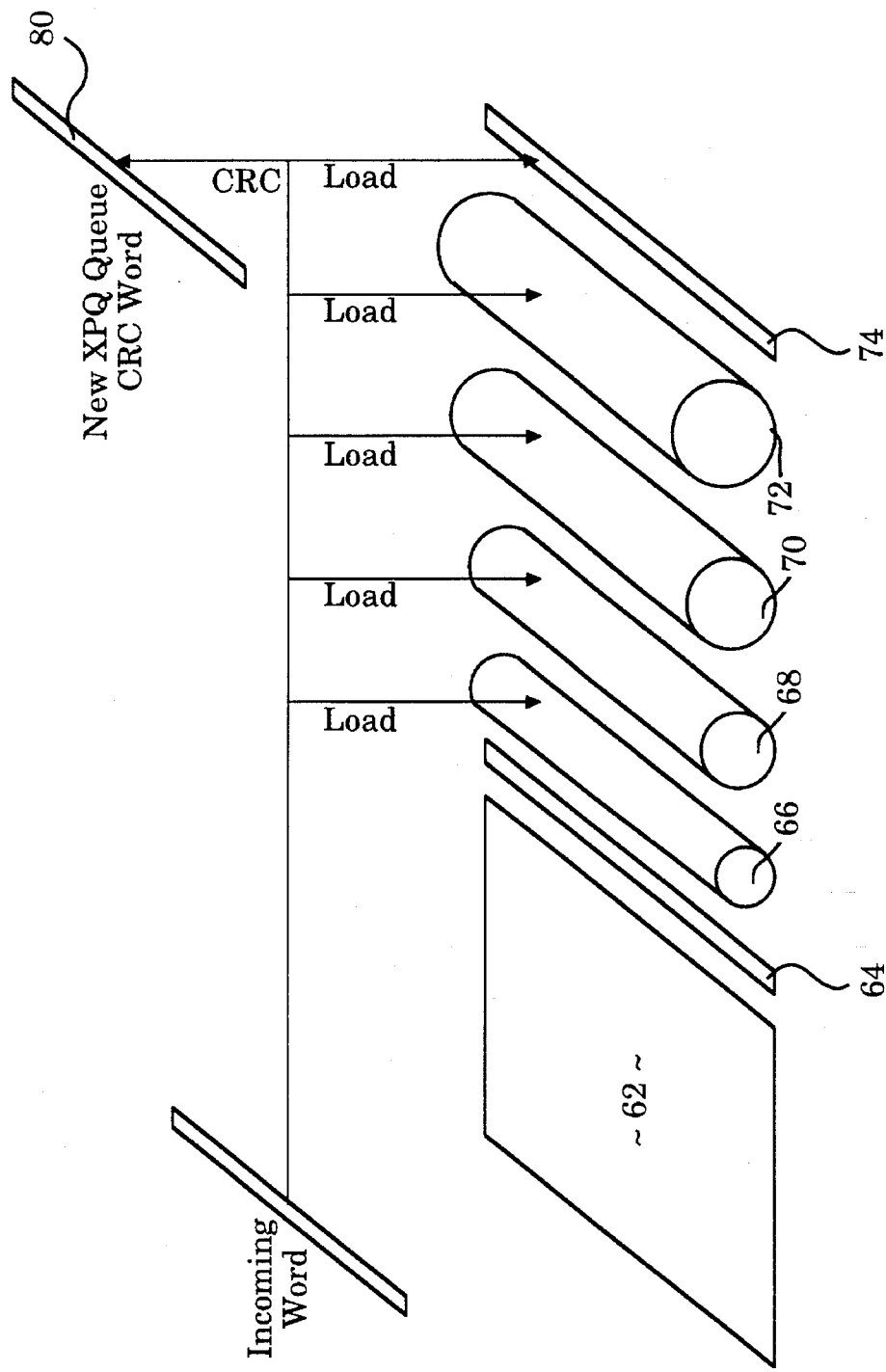
FIG. 7b illustrates the steps of the present invention to decode data encoded in accordance with the steps illustrated in FIG. 6.

Referring to FIG. 7b, if the CRC words are not equivalent, then one or more errors occurred in either the contents of the data buffer, or in the old CRC word stored in buffer 64. In such event, the present invention initializes a new XPQ CRC word and positions the XPQ pointer to the first word position of the leading XPQ queue (in the present example, XPQ queue 66 of FIG. 7b). Incoming words from an encoded packet are shown being loaded into the XORed Prime Queues 66, 68, 70 and 72 in FIG. 7b. As these words are loaded into the XORed Prime Queues, they are also used to calculate a new XORed Prime Queue CRC word 80. The trailing word of the incoming packet is loaded into the old XORed Prime Queue CRC buffer 74. Once all of the XPQ words have been loaded into the respective XPQ queues, the XPQ loading loop is terminated. Additionally, the incoming XPQ CRC word 58 (see FIG. 4) is stored in a buffer 74 and referred to as the "old" XPQ queue CRC word. Once all the old XPQ words are loaded into the XPQ queues, the new XPQ queue CRC word stored in buffer 80 is compared to the old XPQ queue CRC word stored in buffer 74. If the new 80 and old 74 XORed Prime Queue CRC words are equivalent, then error correction may be possible and a new set of XORed Prime Queues can be formed as shown in FIG. 7c.

Figure 7C:
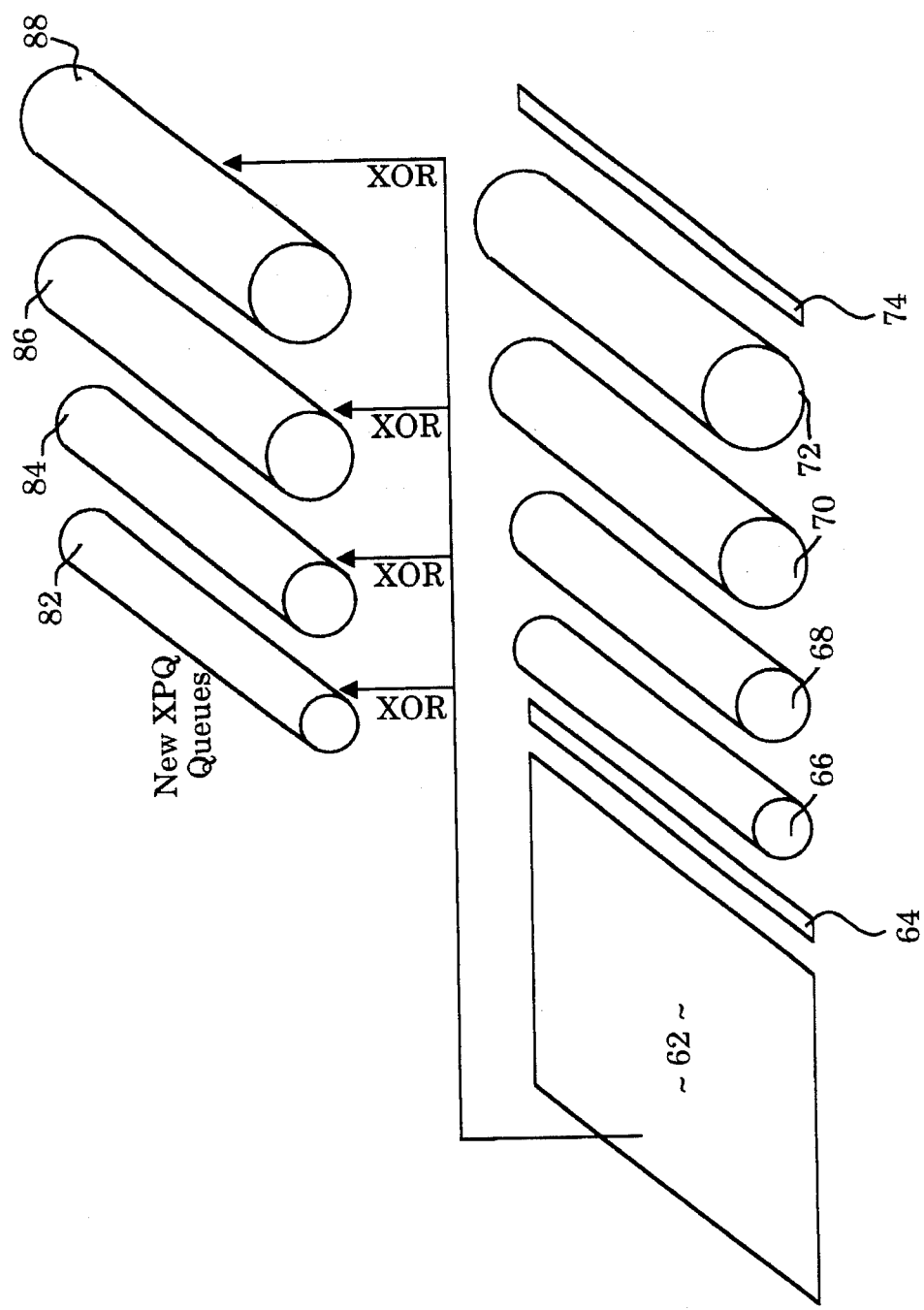
FIG. 7c illustrates the steps of the present invention to decode data encoded in accordance with the steps illustrated in FIG. 6.
Figure 8A:
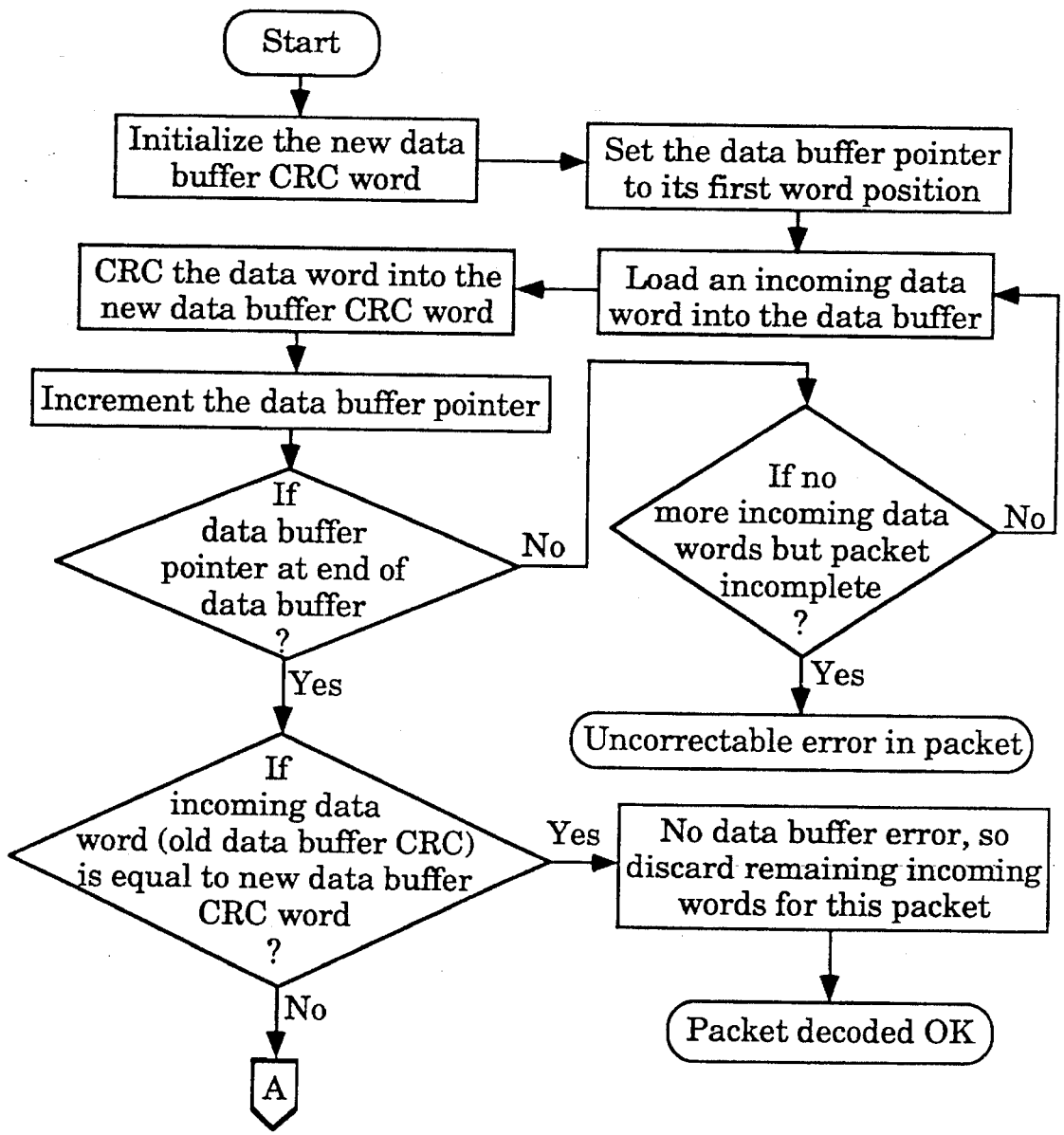
FIG. 8a and 8b illustrate a flow chart of the steps of the present invention used to decode data encoded in accordance with the teachings shown in FIG. 6.
Figure 8B:
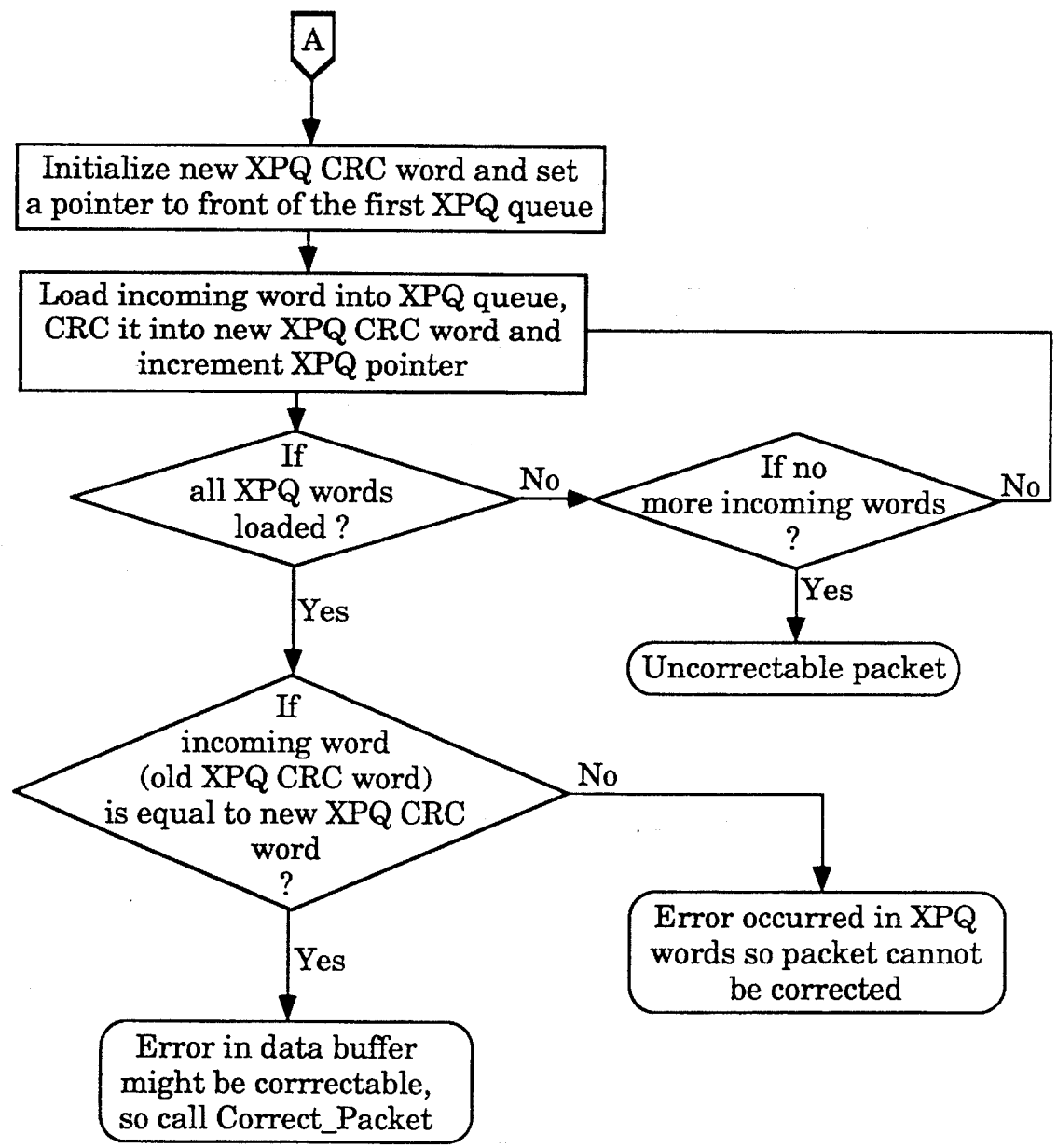

FIG. 7c describes formulation of a new set of XORed Prime Queues 82, 84, 86 and 88. To create these new XPQs, each of the new queues is cleared to zero and pointers are initialized to point to the first word of each of the XPQs 82, 84, 86 and 88, and the first word contained in the data buffer 62. Every word in the data buffer is successively read and XORed into all of the XPQs. The XPQ pointers are incremented or reset to the beginning of their respective queue after each XORing, to form circular queues. This processing is identical to that described previously for encoding the XPQs in FIGS. 5a and 6. The flowchart of FIG. 14a describes what is shown graphically in FIG. 7c.

If the XPQ queue CRC words are not equal, one or more errors occurred in either the incoming XPQ words, or in the incoming XPQ CRC word. In either case, the packet would be considered uncorrectable. If the packet was transmitted, a request of a retransmission of the packet would then take place. In the event the new and the old XPQ CRC words are equivalent, there is a possibility of correcting errors in the contents of the data buffer using the teachings of the present invention. A matrix for the evaluation of the CRC word conditions, and the possibility of correcting errors in illustrated in FIG. 9.

Figure 10:
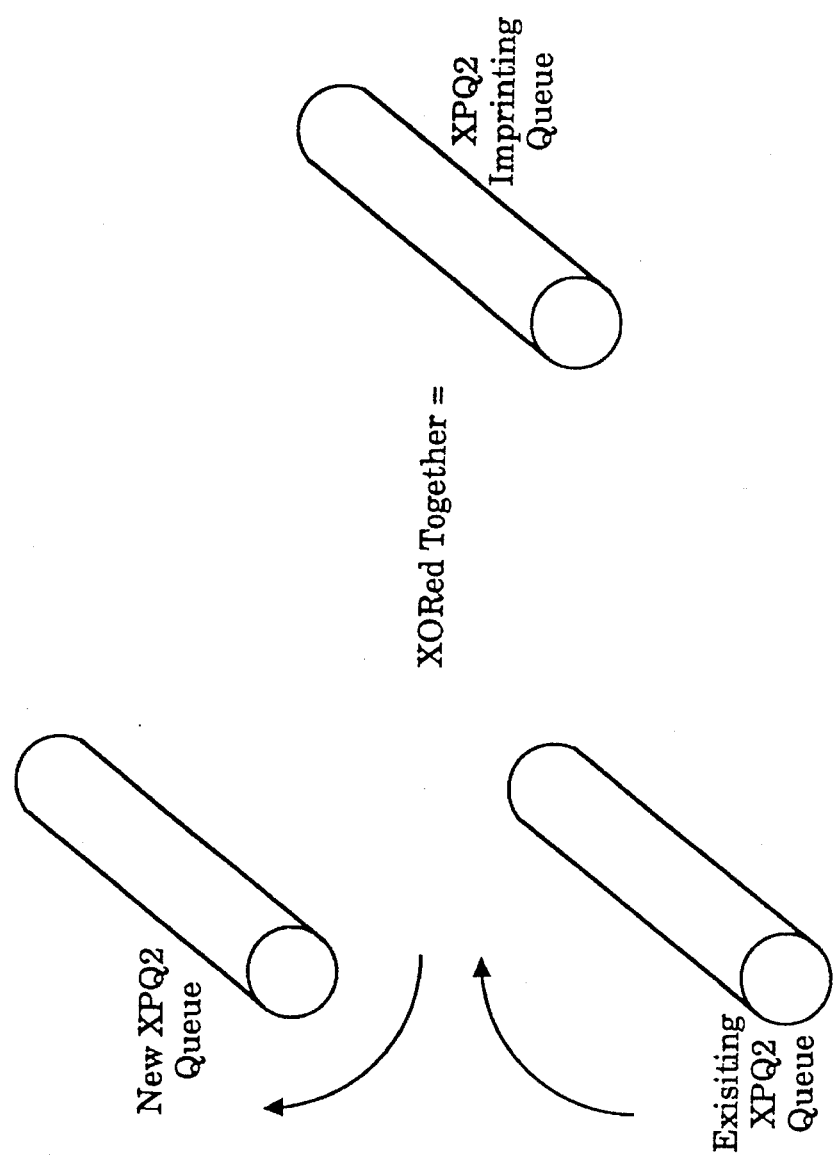
FIG. 10 conceptually illustrates the present invention's mechanism for generating an XPQ imprinting queue for the correction of errors which may have been introduced to data in a digitized message packet.

The present invention's method and apparatus for correcting errors will be described herein. Referring now to FIG. 10, the present invention generates an XPQ imprinter circular queue for each of the XPQ queues. The XPQ2 (66), XPQ3 (68), XPQ5 (70), and XPQ7 (72) queues are reset to zero. In addition, the data buffer pointer is reset to the first word of the data buffer, and a set of new XPQ pointers are initialized to the front of each new XPQ queue. The current data word is then XORed into the XPQ queues 66, 68, 70, and 72. All of the XPQ pointers for the XPQ queues are incremented. If any of the XPQ pointers reaches the tail end of its circular XPQ queue, the pointers are reset to point to the first word of the respective XPQ queue. The data buffer pointer is incremented, such that if the data buffer pointer reaches the end of the data buffer 62, the XPQ processing is complete. Otherwise, the XPQ processing continues until all words in the data buffer 62 have been XORed into the new XPQ queues 66, 68, 70 and 72.

It must be noted, that two sets of XPQs exist at this time. The "old" XPQ queues represent the values previously stored in the XPQ queues 49, 52, 54, and 56, and transmitted to the decoder 38. The "new" XPQ queues are the values of the queues 66, 68, 70 and 72. As illustrated in FIG. 10, each XPQ imprinter circular queue is formed by XORing the values of the new XPQ queues with theses of the old XPQ queues. The process illustrated in FIG. 10 is repeated for the XPQ3, XPQ5, and XPQ7 queues to form XPQn imprinting queues. It will be appreciated, that, through the process of XORing the new and old XPQ queues, whenever the corresponding bits in the respective old and new XPQ queues are identical, the XPQn imprinting queue will contain a zero bit. Whenever the corresponding bits of the new and old XPQ queues differ in value, the XPQn imprinting queue will contain a logical one bit.

Figure 11A:
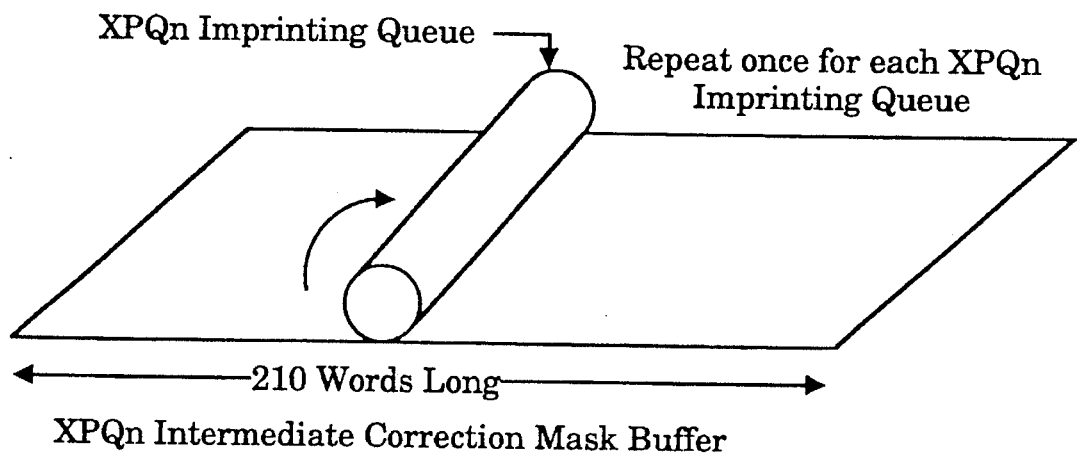
FIGS. 11a and 11b conceptually illustrate the present invention's generation of an XPQ intermediate correction mask buffer, and a final single XPQ correction mask.
Figure 11B:
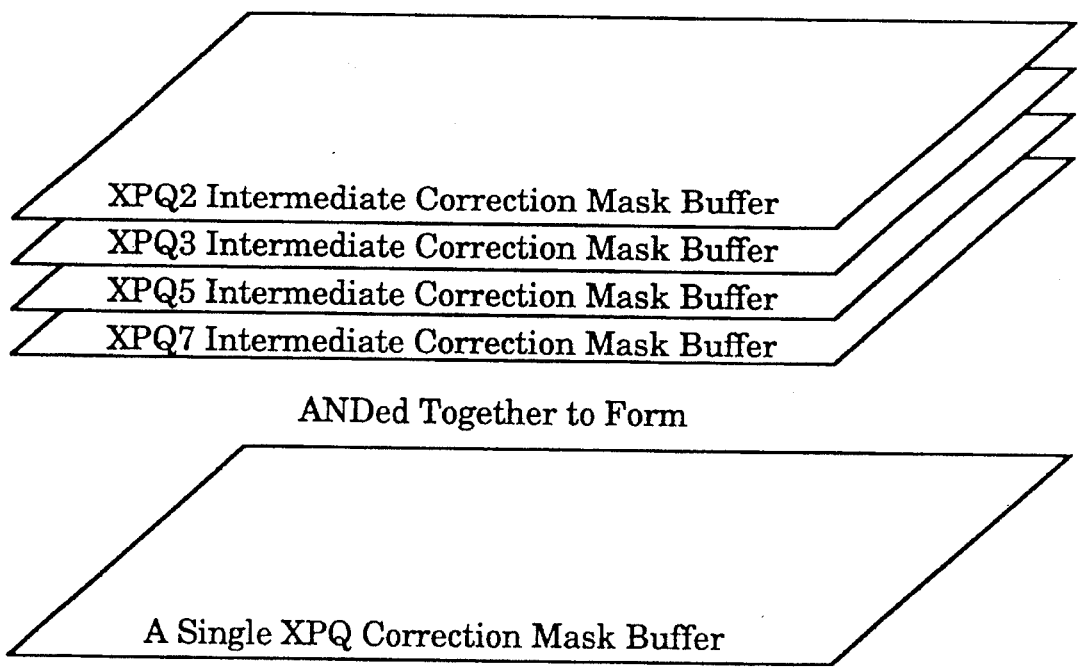
Figure 14A:
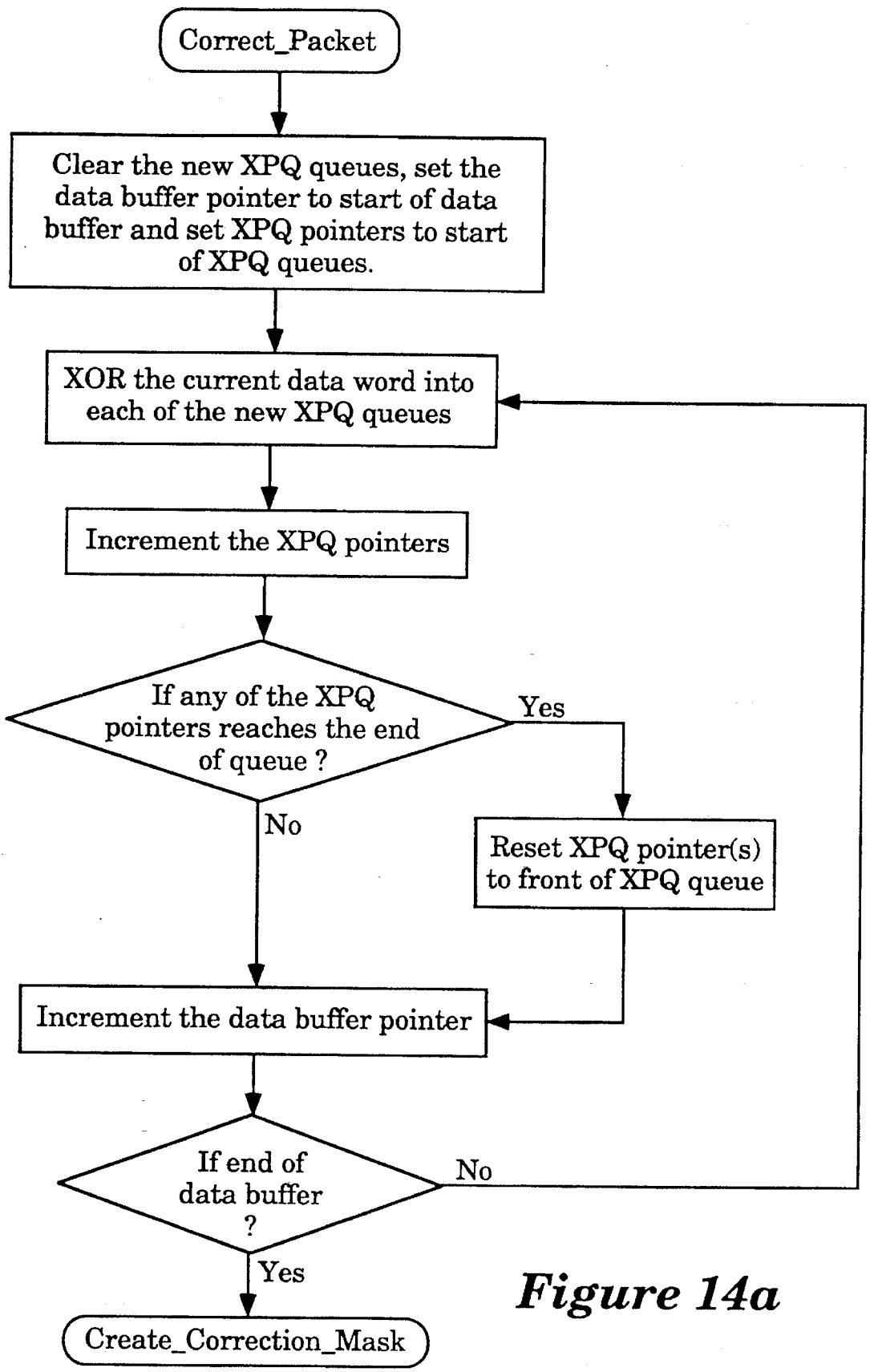
FIGS. 14a, 14b and 14c illustrate flow charts of the steps of the present invention for the detection of errors, creation of a correction mask, and the correction of those errors which are determined to be correctable.
Figure 14B:
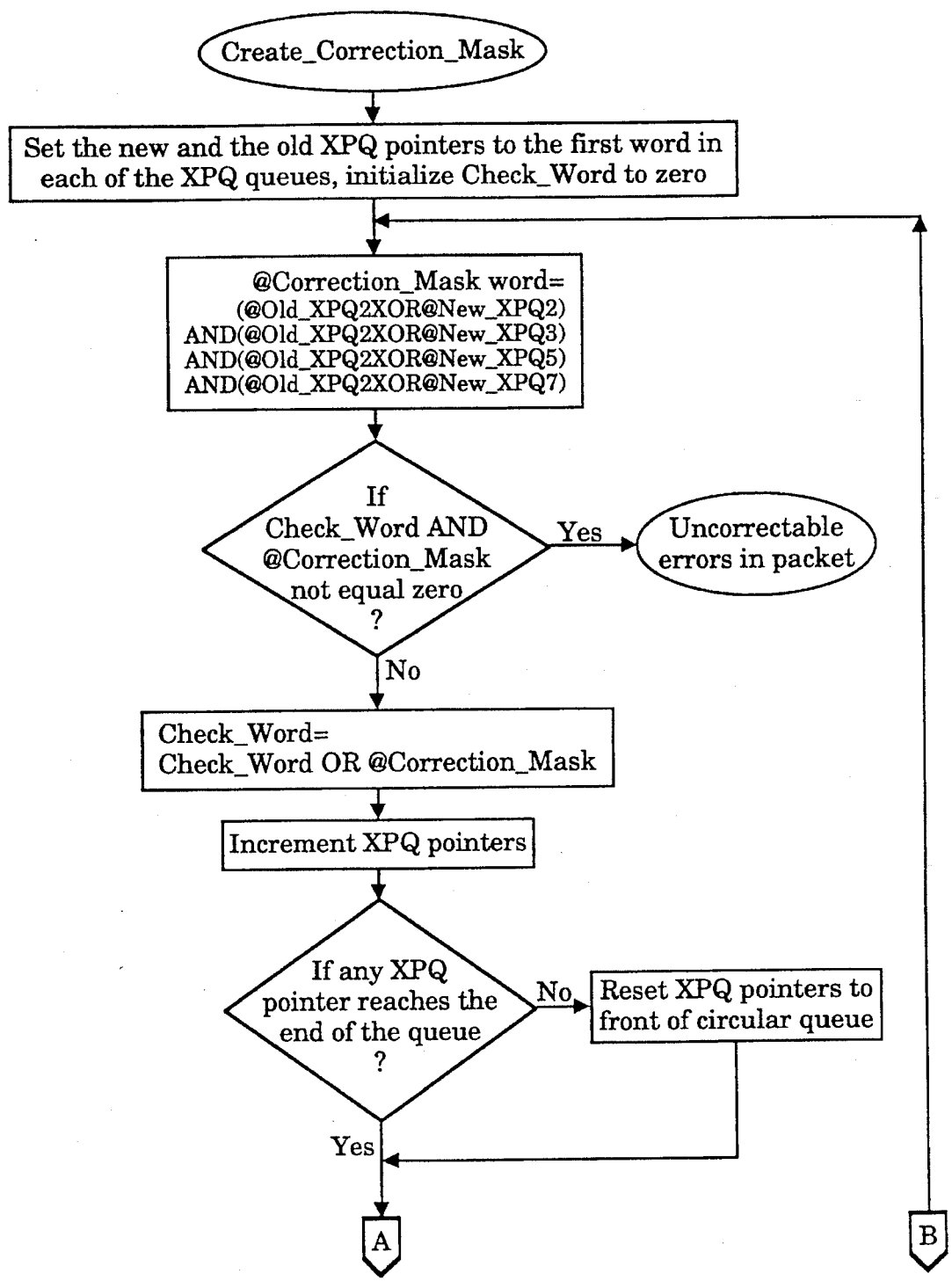
Figure 14C:
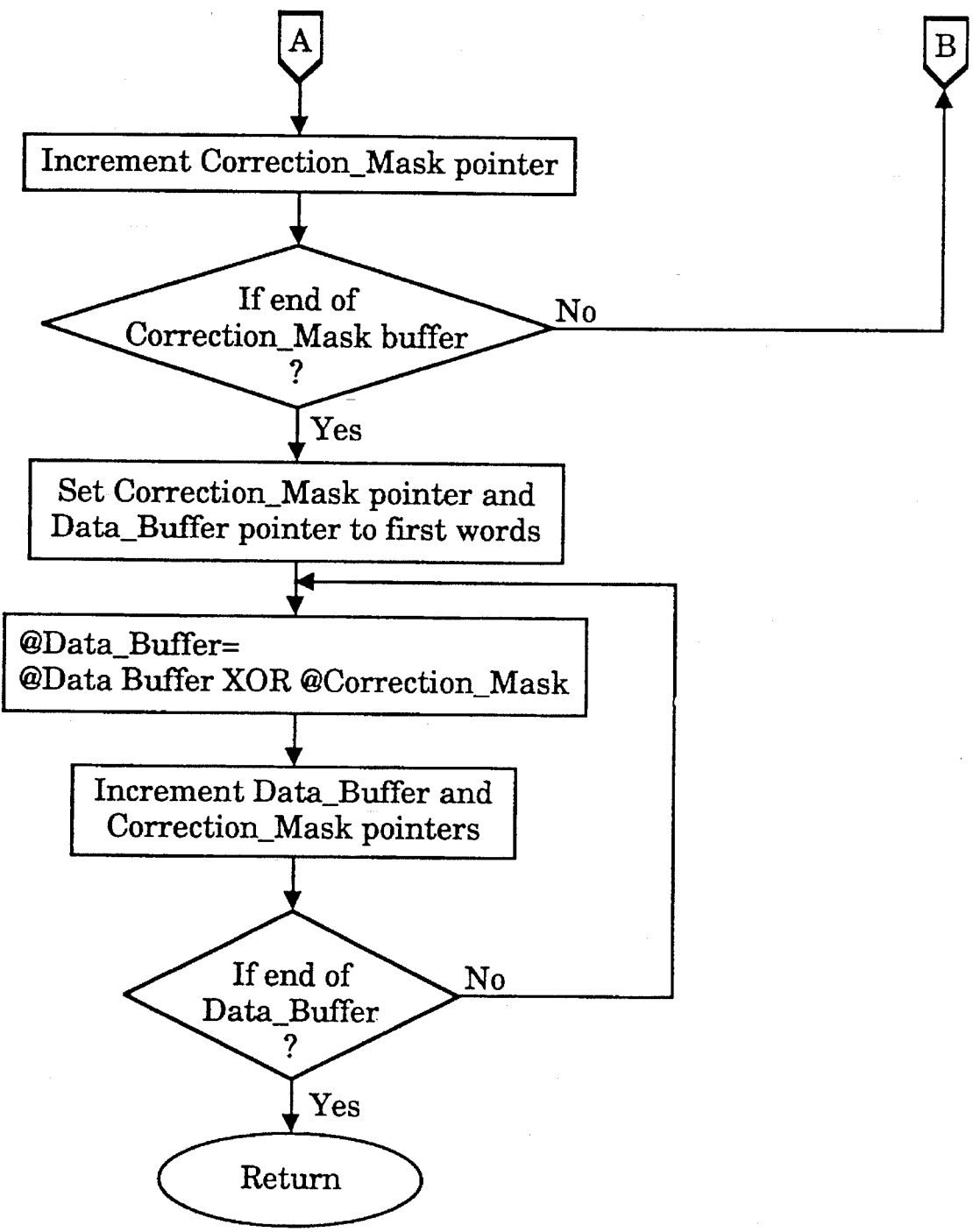

Referring now to FIGS. 11a and 11b, and the flow charts illustrated in FIGS. 14a, 14b and 14c, the creation of a correction mask is described and illustrated. Logically, the correction mask may be defined as:

| Correction_Mask[i] | = | (Old_XPQ[j] | XOR | New_XPQ[j]) |
|---|---|---|---|---|
| | AND | (Old_XPQ[k] | XOR | New_XPQ[k]) |
| | AND | (Old_XPQ[l] | XOR | New_XPQ[l]) |
| | AND | (Old_XPQ[m] | XOR | New_XPQ[m]) |

As conceptually illustrated in FIGS. 11a and 11b, an intermediate correction mask buffer 90 has the same length as the data buffers 45 and 62. For every XPQn imprinting queue, each of the imprinting queues is conceptually "rolled" across the corresponding intermediate correction mask buffer until every word in the mask buffer has been loaded with a word from the XPQn imprinting queue. In effect, an intermediate correction mask is created for each XPQ queue by repeatedly and sequentially writing the contents of the imprinting queue to the intermediate correction mask buffer. As shown in FIGS. 11a and 11b, each of the XPQn intermediate correction mask buffers are then ANDed together to form a single XPQ correction mask buffer. Reference is made to the flow chart illustrated in FIGS. 14b and 14c for the steps of the present invention to create the correction mask buffer.

Figure 12:
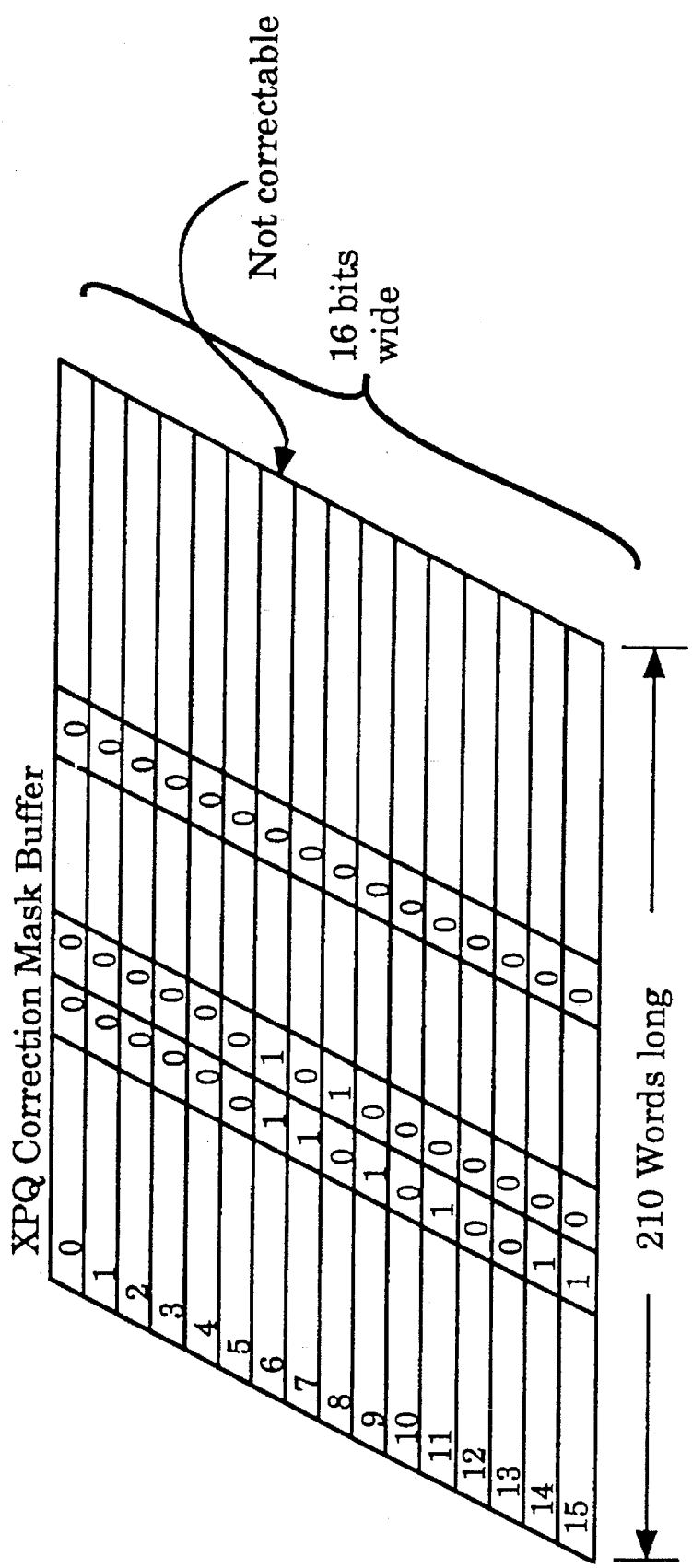
FIG. 12 conceptually illustrates the present invention's evaluation of the XPQ correction mask to determine whether or not error correction is possible once an error is detected.
Figure 13:
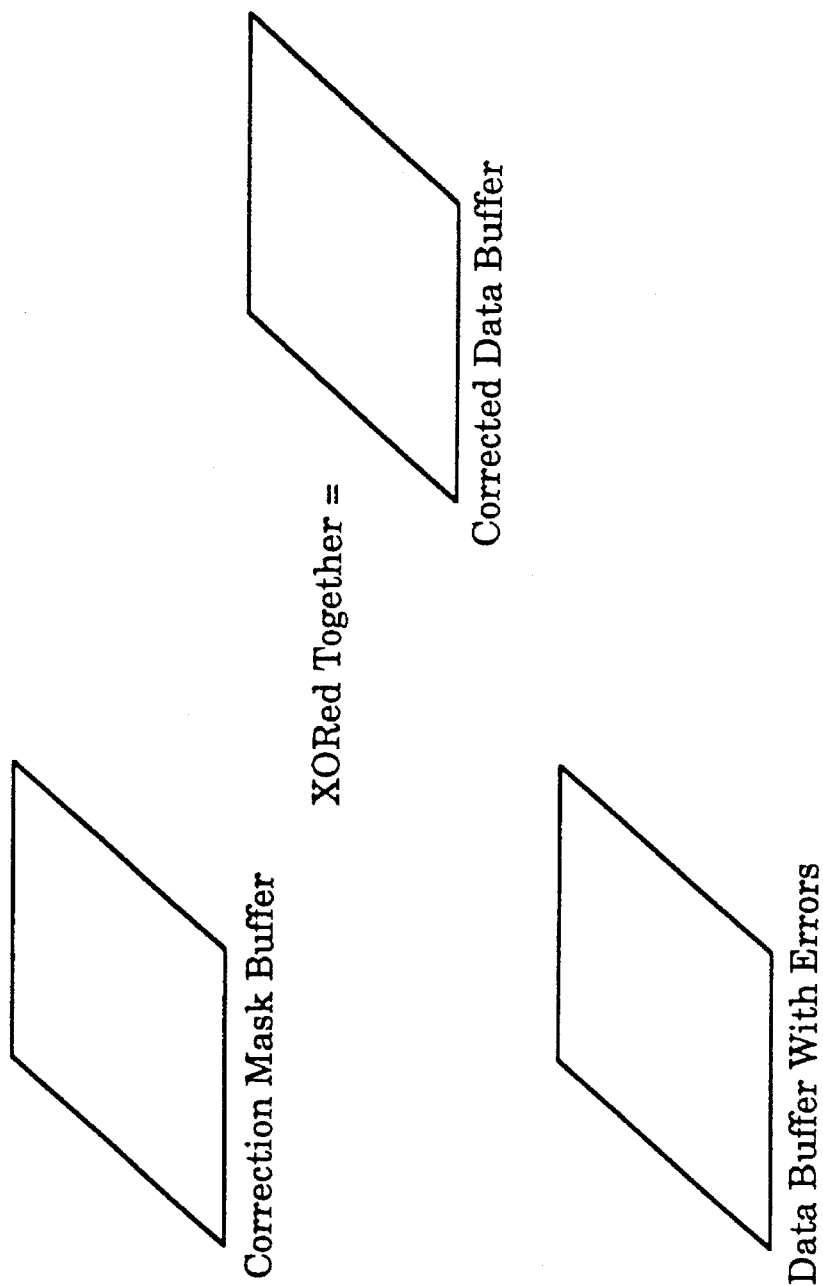
FIG. 13 conceptually illustrates the present invention's method for correcting errors in data using the XPQ correction mask buffer.

Referring now to FIG. 12, once the XPQ correction mask buffer has been created in accordance with the teachings described herein, the correction mask buffer must be evaluated to determine which errors are correctable or are uncorrectable. XPQ error correction can correct errors in the contents of the data buffer when no more than a single logical 1 occurs in each of the XPQ correction mask buffer's bit columns. All other bits within a bit column, in accordance with the implementation of the present invention, must have a logical value of zero. The maximum number of bits that can be corrected within a data buffer is the same as the word width of the data buffer (16 in the example shown in FIG. 12). Each of these 16 error bits must occur in separate bit columns (as they would if a 16 bit long burst error occurred). As illustrated in FIG. 12, bit column 6 includes two 1 values and, therefore, correction cannot properly occur. All other columns in which a single logical 1 is present, are correctable in accordance with the teachings of the present invention. Let us assume for sake of example that only a single 1 is present in any of the bit columns comprising the correction mask buffer. As conceptually illustrated in FIG. 13, and described in the flow chart of FIGS. 14b and 14c, the contents of the correction mask buffer is XORed together with the existing data buffer contents, to obtain corrected data buffer contents without errors.

Figure 15:
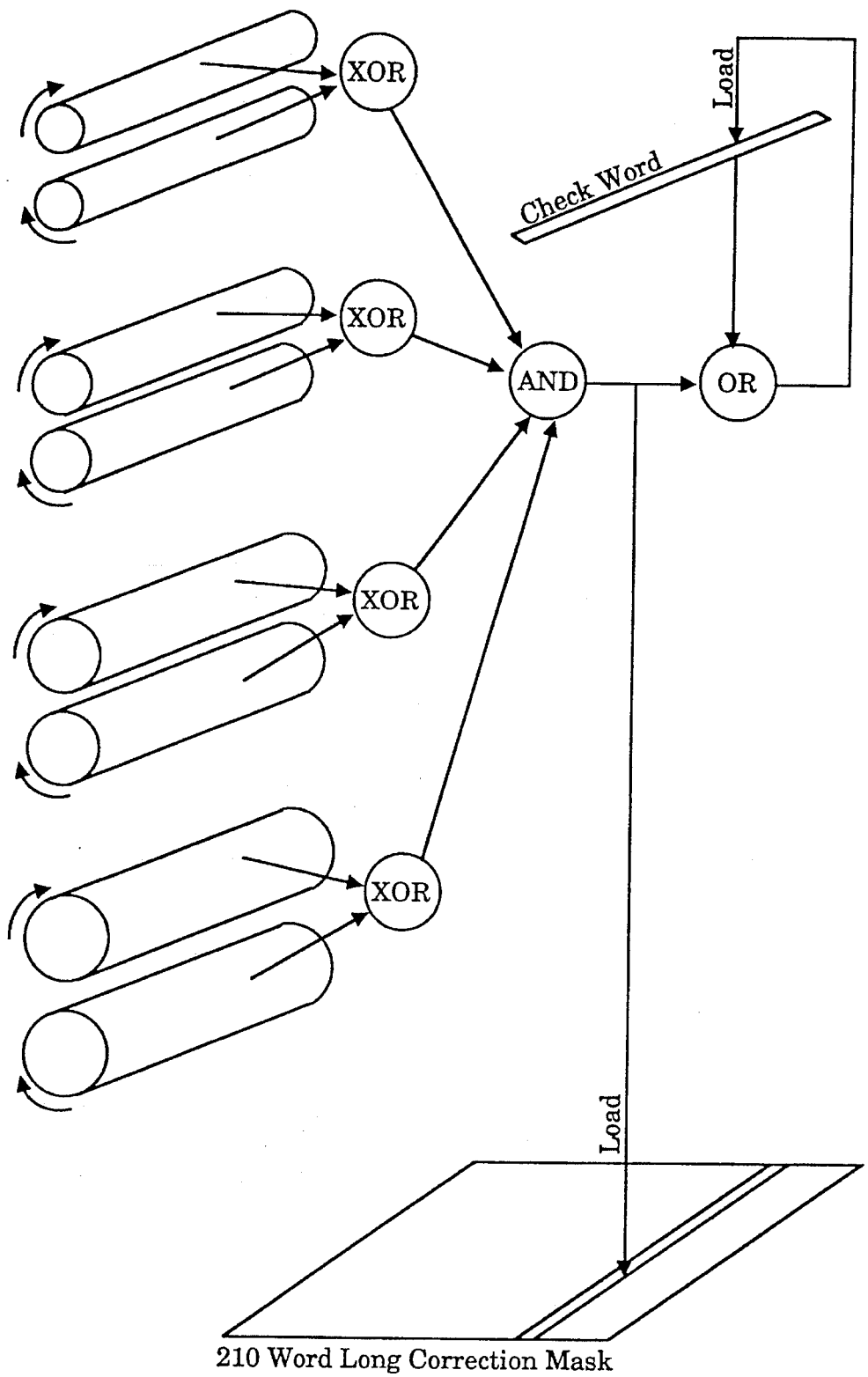
FIG. 15 conceptually illustrates the method of the present invention as described in the steps of FIGS. 14b and 14c.

FIG. 15 illustrates an alternative conceptual representation of the process for creating a correction mask as described in FIGS. 14b and 14c. As can be seen, each respective new and old XPQ is concurrently XORed together and the results of all the XOR operations are immediately ANDed together to produce the word that is to be loaded into the final correction mask buffer. This process is repeated for each word in the XPQs. The final correction mask is formed by repeatedly and sequentially loading the word resulting from the AND operation into the correction mask buffer. Thus, the intermediate steps of forming imprinting queues and intermediate correction masks, as shown in FIGS. 11a and 11b, are eliminated.

Referring now to FIG. 16, a simple example of the operation of the present invention is illustrated for a 6 word long, 1 bit wide, input message. In the example of FIG. 16, the 6 word long input message is encoded with two syndrome queues, XPQ2 and XPQ3. For simplicity, a single bit error is inserted. As shown, error processing occurs and the message with the error is converted back into a message without errors using the teachings of the present invention. As shown in FIG. 16, an error is inserted in the second word in step two. Using the teachings of the present invention, as described herein, as illustrated in the steps of the example shown in FIG. 16, a corrected message is recovered. The comparison of the corrected value of the corrected message with the original data discloses that the bits are identical, and therefore, that the correction method of the present invention has resulted in the recovery of the original data message.

Referring now to FIG. 17, a chart illustrating various combinations of the result of various XPQ lengths, number of necessary XOR operations, and the total possible data words covered by the present invention is illustrated. One of the principal benefits of the present invention is that various parameters such as XPQ queue lengths may be dynamically set for any particular application to achieve maximum error detection and correction optimization. As illustrated in FIG. 17, as an example in row 2, an XPQ queue of 2 words, an XPQ queue of 3 words and an XPQ queue of 5 words requires a total of three XOR operations, and provides error correction and detection for up to 30 words in a data buffer. Additionally, the chart shown in FIG. 17 also discloses a redundancy rate percentage, a correction capability percentage, and an error correction capability of the present invention.

A system wherein the XPQ error detection and correction technique is used to provide error detection and correction for transmitted data is capable of providing channel adaptive EDC. In such a system the data packet size can be adjusted to increase or decrease the correction capability of the EDC scheme in dynamic accordance with channel noise conditions. For example, during particularly noisy channel conditions a data block size of six words might be selected with XPQ lengths of two and three words. This would provide the relatively high correction capability of 9.1% as shown in FIG. 17. At times when the transmission channel was less noisy, a longer data block size could be selected to reduce the redundancy rate. A channel adaptive scheme such as this might be particularly useful for planetary and deep space probes where transmission channel noise conditions vary dynamically. The same technique would also be useful for aircraft flying through varying weather conditions such as storms.

A variation in implementation of XPQ EDC useful for data transmission systems would be to only send the data buffer and data buffer CRC word. Upon checking the data buffer CRC word and finding inequality, the receiving station could request transmission of the XPQ words and the XPQ CRC word to perform error correction. Since the XPQ words and XPQ CRC word would only be sent when errors occurred, channel bandwidth utilization could be minimized. If the XPQ packet still did not allow error correction, then the conventional step of data retransmission could occur. This would result in very low bandwidth utilization for a communication scheme with excellent EDC capabilities. This EDC scheme would be useful for planetary or deep space probes where transmission time and the energy required to transmit data need to be conserved. This technique is equally applicable to aircraft communications with satellites or the ground.

Accordingly, apparatus and methods have been disclosed having particular application for use in detecting and correcting errors in digitized data. Although the present invention has been described with reference to FIGS. 1 through 17, it will be apparent to one skilled in the art that the present invention has utility far exceeding that disclosed in the figures. It is contemplated that many changes and modifications may be made, by one of ordinary skill in the art, without departing from the spirit and scope of the invention as disclosed herein.

I claim:

1. A method for encoding digital data, comprising the steps of:

providing a source of digital data, said digital data being organized into a plurality of words;

providing a first data buffer, a first XPQ circular queue and a first XPQ CRC word buffer;

sequentially loading a predefined number (N) of said words into said first data buffer;

sequentially conducting a logical XOR operation on each sequential data word and storing the resulting value of said XOR operation in said first XPQ circular queue;

generating an XPQ CRC word from said value stored in said first XPQ circular queue and storing said XPQ CRC word in said first XPQ CRC word buffer;

whereby said data is encoded in a data packet.

2. The method as defined by claim 1 further including a method for decoding said data packet, comprising the steps of:

sequentially reading said N data words into a second data buffer;

sequentially conducting a logical XOR operation on each sequential data word and storing the resulting value of said XOR operation in a second XPQ circular queue.

3. The method as defined by claim 2 further including the step of conducting an XOR operation on each word in said first XPQ circular queue with its corresponding word in said second XPQ circular queue and storing the result of said XOR operation in an imprinting queue.

4. The method as defined by claim 3 further including the step of creating a correction mask buffer using said imprinting queue.

5. The method as defined by claim 4 further including the step of XORing each word comprising said correction mask buffer with the corresponding word contents in said second data buffer to obtain corrected data buffer contents.

6. A system for encoding digital data, comprising:

a digital data source providing digital data, said digital data being organized into a plurality of words;

a first data buffer sequentially receiving a predefined number (N) of said words;

a first XPQ circular queue storing the logical result of an XOR operation conducted on each sequential data word of said N words;

a first XPQ CRC word buffer storing the result of a cyclic redundancy check conducted on the value stored in said first XPQ circular queue;

whereby said digital data is encoded in a data packet.

7. The system as defined by claim 6 further including:

a second data buffer sequentially receiving said digital data of N words;

a second XPQ circular queue sequentially receiving each of said N words and storing a resulting value of a logical XOR operation conducted on each sequential data word of said N words.

8. The system as defined by claim 7 further including an imprinting queue for storing the result of an XOR operation between each word in said first XPQ circular queue and its corresponding word in said second XPQ circular queue.

9. The system as defined by claim 8 further including a correction mask buffer generated from said imprinting queue.

10. The system as defined by claim 9 wherein a corrected data buffer is formed by XORing each word comprising said correction mask buffer with the corresponding word in said second data buffer.

11. A method for encoding digital data, comprising the steps of:

providing a source of digital data in the form of successive words of binary information;

providing a first data buffer having a first load pointer for storing N words;

providing at least two XPQ circular queues (XPQ1 and XPQ2) for generating an error correction syndrome, wherein each of said XPQ circular queues has a length which is a prime number, and wherein each of said XPQ circular queues has a length which is unique with respect to other of said XPQ circular queues;

providing a first CRC buffer;

providing a first XPQ CRC word buffer;

sequentially loading each data word of said N data words into said first data buffer, and generating a CRC word stored in said first CRC buffer;

executing a logical XOR operation on each of said sequentially loaded N data words in each of said XPQ circular queues, and generating an XPQ CRC word from the words comprising said XPQ circular queues;

whereby said N data words are encoded.

12. The method as defined by claim 11 wherein said XPQ circular queues are initially cleared before said execution of said XOR operations and XPQ load pointers are set to a first XPQ data word position.

13. The method as defined by claim 12 wherein said first load pointer and each of said XPQ pointers are incremented with the sequential loading of each data word.

14. The method as defined by claim 11 further including a method for decoding said encoded N data words, comprising the steps of:

providing a second data buffer;

providing at least two circular queues XPQ1' and XPQ2' for generating an error correction syndrome, wherein said circular queue XPQ1' has a length equal to the length of circular queue XPQ1, and said circular queue XPQ2' has a length equal to the length of circular queue XPQ2 providing a second CRC buffer;

providing a second XPQ CRC word buffer;

transmitting said N data words stored in said first data buffer to said second data buffer, sequentially loading said N data words into said second data buffer, and generating a second CRC word stored in said second CRC buffer;

executing a logical XOR operation on each of said N data words transmitted from said first data buffer to said second data buffer in each of said circular queues XPQ1' and XPQ2', and generating an XPQ CRC word from the words comprising said XPQ' circular queues.

15. The method as defined by claim 14 further including the step of detecting errors in said N data words stored in said second data buffer by comparing the contents of said first CRC buffer with the contents of said second CRC buffer, such that in the event said contents are not equal, one or more errors exist in said N data words stored in said second data buffer.

16. The method as defined by claim 15 further including the step of detecting if said errors in said N data words stored in said second data buffer may be correctable by comparing the contents of said first XPQ CRC buffer with the contents of said second XPQ CRC buffer, such that if said contents are equal said errors in data stored in said second data buffer may be correctable.

17. The method as defined by claim 16 further including the method of creating an XPQ correction mask, comprising the steps of:

providing a correction mask buffer having a capacity of N words;

executing a logical XOR operation between each word comprising said XPQ1 and XPQ1' circular queues to obtain a first result;

executing a logical XOR operation between each word comprising said XPQ2 and XPQ2' circular queues to obtain a second result;

logically ANDing each corresponding first result and second result to produce a final result for each word;

repetitively sequentially writing the final result for each word to said XPQ correction mask buffer until every available word is written into the XPQ correction mask buffer, thereby creating said XPQ correction mask.

18. The method as defined by claim 17 further including the step of evaluating the contents of said XPQ correction mask to determine if said errors are correctable.

19. The method as defined by claim 18 wherein said evaluating step includes determining if the contents of said XPQ correction mask include more than a single logical one value in any bit column, such that in the event that any of said bit columns contain more than a single logical one, said errors are not correctable.

20. The method as defined by claim 19 wherein in the event said errors are correctable, said errors are corrected by executing a logical XOR operation between each corresponding word of said XPQ correction mask and said second data buffer to generate a corrected data buffer.

21. The method as defined by claim 16 further including the method of creating XPQ imprinter circular queues, comprising the steps of:

executing a logical XOR operation between each word comprising said XPQ1 and XPQ1' circular queues to obtain an XPQ1 imprinting queue;

executing a logical XOR operation between each word comprising said XPQ2 and XPQ2' circular queues to obtain an XPQ2 imprinting queue.

22. The method as defined by claim 21 further including the method of generating an intermediate correction mask comprising the steps of:

providing first and second intermediate correction mask buffers having a capacity of N data words;

repetitively sequentially writing the contents of said XPQ1 imprinting queue into said first intermediate correction mask buffer, beginning with the first word stored in said XPQ1 imprinting queue and ending with the last word stored in said XPQ1 imprinting queue, until every available location in said first intermediate correction buffer is written into;

repetitively sequentially writing the contents of said XPQ2 imprinting queue into said second intermediate correction mask buffer, beginning with the first word stored in said XPQ2 imprinting queue and ending with the last word stored in said XPQ2 imprinting queue, until every available location in said second intermediate correction buffer is written into;

logically ANDing each corresponding word of said first and second intermediate correction buffers to obtain a single XPQ correction mask.

23. The method as defined by claim 22 further including the step of evaluating the contents of said XPQ correction mask to determine if said errors are correctable.

24. The method as defined by claim 23 wherein said evaluating step includes determining if the contents of said XPQ correction mask include more than a single logical one value in any bit column, such that in the event that any of said bit columns contain more than a single logical one, said errors are not correctable.

25. The method as defined by claim 24 wherein in the event said errors are correctable, said errors are corrected by executing a logical XOR operation between each corresponding word of said XPQ correction mask buffer and said second data buffer to generate a corrected data buffer.

26. A system for encoding digital data, comprising:

a source of digital data in the form of successive words of binary information;

a first data buffer having a first load pointer for storing N words;

at least two XPQ circular queues (XPQ1 and XPQ2) for generating an error correction syndrome, wherein each of said XPQ circular queues has a length which is a prime number, and wherein each of said XPQ circular queues has a length which is unique with respect to other of said XPQ circular queues, and wherein the product of the lengths of said circular queues equals N;

a first CRC buffer;

a first XPQ CRC word buffer;

wherein each data word of said N data words is sequentially loaded into said first data buffer, and a CRC word is generated and stored in said first CRC buffer;

wherein each of said XPQ circular queues stores the results of logical XOR operations on each of said sequentially loaded N data words, and wherein further there is stored in said XPQ CRC word buffer an XPQ CRC word from the words comprising said XPQ circular queues;

whereby said N data words are encoded.

27. The system as defined by claim 26 wherein said XPQ circular queues are initially cleared before said execution of said XOR operations and XPQ load pointers are set to a first XPQ data word position.

28. The system as defined by claim 27 wherein said first load pointer and each of said XPQ pointers are incremented with the sequential loading of each data word.

29. The system as defined by claim 26 further including:

a second data buffer;

at least two circular queues XPQ1' and XPQ2' for generating an error correction syndrome, wherein said circular queue XPQ1' has a length equal to the length of circular queue XPQ1, and said circular queue XPQ2' has a length equal to the length of circular queue XPQ2;

a second CRC buffer;

a second XPQ CRC word buffer;

wherein said N data words are transmitted to said second data buffer, and sequentially loaded into said second data buffer;

wherein a second CRC word is stored in said second CRC buffer;

wherein a logical XOR operation is executed on each of said N data words transmitted from said first data buffer to said second data buffer in each of said circular queues XPQ1' and XPQ2', and wherein an XPQ CRC word is generated from the words comprising said XPQ' circular queues.

30. The system as defined by claim 29 further including detection means for detecting errors in said N data words stored in said second data buffer by comparing the contents of said first CRC buffer with the contents of said second CRC buffer, such that in the event said contents are not equal, one or more errors exist in said N data words stored in said second data buffer.

31. The system as defined by claim 30 wherein said detection means further determines if said errors in said N data words stored in said second data buffer may be correctable by comparing the contents of said first XPQ CRC buffer with the contents of said second XPQ CRC buffer, such that if said contents are equal said errors in data stored in said second data buffer may be correctable.

32. The system as defined by claim 31 further including:

a single XPQ correction mask obtained by repetitively sequentially writing a final result to an XPQ correction mask buffer, the final result being a product of a logical AND operation using a first result and a second result as operands, the first result being formed by logically XORing each word comprising said XPQ1 and XPQ1' circular queues, the second result being formed by logically XORing each word comprising said XPQ2 and XPQ2' circular queues.

33. The system as defined by claim 32 wherein said detection means further evaluates the contents of said XPQ correction mask buffer to determine if said errors are correctable.

34. The system as defined by claim 33 wherein said detection means determines if the contents of said XPQ correction mask buffer include more than a single logical one value in any bit column, such that in the event that any of said bit columns contain more than a single logical one, said errors are not correctable.

35. The system as defined by claim 34 wherein in the event said errors are correctable, said errors are corrected by executing a logical XOR operation between each corresponding word of said XPQ correction mask and said second data buffer to generate a corrected data buffer.

36. The system as defined by claim 31 further including:
an XPQ1 imprinting queue storing the logical result of executing an XOR operation between each word comprising said XPQ1 and XPQ1' circular queues;
an XPQ2 imprinting queue storing the logical result of executing an XOR operation between each word comprising said XPQ2 and XPQ2' circular queues.

37. The system as defined by claim 36 further including:
a first intermediate correction mask buffer having a capacity of N data words formed by repetitively sequentially writing the contents of said XPQ1 imprinting queue into said first intermediate correction mask buffer, beginning with the first word stored in said XPQ1 imprinting queue and ending with the last word stored in said XPQ1 imprinting queue, until every available location in said first intermediate correction buffer is written into;
a second intermediate correction mask buffer having a capacity of N data words formed by repetitively sequentially writing the contents of said XPQ2 imprinting queue into said second intermediate correction mask buffer, beginning with the first word stored in said XPQ2 imprinting queue and ending with the last word stored in said XPQ2 imprinting queue, until every available location in said second intermediate correction buffer is written into;
a single XPQ correction mask obtained by logically ANDing each corresponding word of said first and second intermediate correction buffers.

38. The system as defined by claim 37 wherein said detection means further evaluates the contents of said XPQ correction mask to determine if said errors are correctable.

39. The system as defined by claim 38 wherein said detection means determines if the contents of said XPQ correction mask include more than a single logical one value in any bit column, such that in the event that any of said bit columns contain more than a single logical one, said errors are not correctable.

40. The system as defined by claim 39 wherein in the event said errors are correctable, said errors are corrected by executing a logical XOR operation between each corresponding word of said XPQ correction mask and said second data buffer to generate a corrected data buffer.

41. A method for the detection and correction of errors in digital data, comprising the steps of:
providing a source of digital data in the form of successive words of binary information;
providing a first data buffer for storing N words;
providing at least two XPQ circular queues (XPQ1 and XPQ2) for generating an error correction syndrome, wherein each of said XPQ circular queues has a length which is a prime number, and wherein each of said XPQ circular queues has a length which is unique with respect to other of said XPQ circular queues;
providing a first CRC buffer;
providing a first XPQ CRC word buffer;
sequentially loading each data word of said N data words into said first data buffer, and generating a CRC word stored in said first CRC buffer;
executing a logical XOR operation on each of said sequentially loaded N data words in each of said XPQ circular queues, and generating an XPQ CRC word from the words comprising said XPQ circular queues;
providing a second data buffer;
providing at least two circular queues XPQ1' and XPQ2' for generating an error correction syndrome, wherein said circular queue XPQ1' has a length equal to the length of circular queue XPQ1, and said circular queue XPQ2' has a length equal to the length of circular queue XPQ2
providing a second CRC buffer;
providing a second XPQ CRC word buffer;
transmitting said N data words stored in said first data buffer to said second data buffer, sequentially loading said N data words into said second data buffer, and generating a second CRC word stored in said second CRC buffer;
executing a logical XOR operation on each of said N data words transmitted from said first data buffer to said second data buffer in each of said circular queues XPQ1' and XPQ2', and generating an XPQ CRC word from the words comprising said XPQ' circular queues;
detecting errors in said N data words stored in said second data buffer by comparing said the contents of said first CRC buffer with the contents of said second CRC buffer, such that in the event said contents are not equal, one or more errors exist in said N data words stored in said second data buffer;
detecting if said errors in said N data words stored in said second data buffer may be correctable by comparing the contents of said first XPQ CRC buffer with the contents of said second XPQ CRC buffer, such that if said contents are equal said errors in data stored in said second data buffer may be correctable;
creating XPQ imprinter circular queues, comprising the steps of:
executing a logical XOR operation between each word comprising said XPQ1 and XPQ1' circular queues to obtain an XPQ1 imprinting queue;
executing a logical XOR operation between each word comprising said XPQ2 and XPQ2' circular queues to obtain an XPQ2 imprinting queue;
generating an intermediate correction mask comprising the steps of:
providing first and second intermediate correction mask buffers having a capacity of N data words;
repetitively sequentially writing the contents of said XPQ1 imprinting queue into said first intermediate correction mask buffer, beginning with the first word stored in said XPQ1 imprinting queue and ending with the last word stored in said XPQ1 imprinting queue, until every available location in said first intermediate correction mask buffer is written into;

repetitively sequentially writing the contents of said XPQ2 imprinting queue into said second intermediate correction mask buffer, beginning with the first word stored in said XPQ2 imprinting queue and ending with the last word stored in said XPQ2 imprinting queue, until every available location word in said second intermediate correction mask buffer is written into;

logically ANDing each corresponding word of said first and second intermediate correction buffers to obtain a single XPQ correction mask;

evaluating the contents of said XPQ correction mask to determine if said errors are correctable, including determining if the contents of said XPQ correction mask include more than a single logical one value in any bit column, such that in the event that any of said bit columns contain more than a single logical one, said errors are not correctable;

wherein in the event said error is correctable, said errors are corrected by executing a logical XOR operation between each corresponding word of said XPQ correction mask and said second data buffer to generate a corrected data buffer whereby errors are detected and corrected.

* * * * *